(12) United States Patent
Sui et al.

(10) Patent No.: US 11,659,762 B2
(45) Date of Patent: May 23, 2023

(54) FLEXIBLE DISPLAY PANEL AND MANUFACTURING METHOD THEREFOR, AND FLEXIBLE DISPLAY APPARATUS

(71) Applicant: BOE TECHNOLOGY GROUP CO., LTD., Beijing (CN)

(72) Inventors: Kai Sui, Beijing (CN); Zhongyuan Sun, Beijing (CN); Jinxiang Xue, Beijing (CN); Xiaofen Wang, Beijing (CN); Chao Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 522 days.

(21) Appl. No.: 16/966,710

(22) PCT Filed: Aug. 6, 2019

(86) PCT No.: PCT/CN2019/099504
§ 371 (c)(1),
(2) Date: Jul. 31, 2020

(87) PCT Pub. No.: WO2021/022490
PCT Pub. Date: Feb. 11, 2021

(65) Prior Publication Data
US 2023/0088187 A1 Mar. 23, 2023

(51) Int. Cl.
| | |
|---|---|
| H10K 77/10 | (2023.01) |
| H10K 50/844 | (2023.01) |
| H10K 59/131 | (2023.01) |
| H10K 71/00 | (2023.01) |
| H10K 71/80 | (2023.01) |
| H10K 59/12 | (2023.01) |
| H10K 102/00 | (2023.01) |

(52) U.S. Cl.
CPC ........ *H10K 77/111* (2023.02); *H10K 50/844* (2023.02); *H10K 59/131* (2023.02); *H10K 71/00* (2023.02); *H10K 71/80* (2023.02); *H10K 59/1201* (2023.02); *H10K 2102/311* (2023.02)

(58) Field of Classification Search
None
See application file for complete search history.

(56) References Cited

U.S. PATENT DOCUMENTS

| | | | | |
|---|---|---|---|---|
| 11,462,699 | B2 * | 10/2022 | Xue | H01L 51/5253 |
| 2020/0137472 | A1 * | 4/2020 | Won | H04R 7/045 |
| 2021/0083212 | A1 * | 3/2021 | Jung | H01L 51/5253 |

\* cited by examiner

*Primary Examiner* — J. E. Schoenholtz
(74) *Attorney, Agent, or Firm* — Procopio, Cory, Hargreaves & Savitch LLP

(57) ABSTRACT

A flexible display panel includes: a stretchable base film; an adhesive layer disposed on a surface of the stretchable base film; a flexible substrate including a plurality of display units and a plurality of connection units, every two adjacent display units being connected by at least one connection unit; and a plurality of first release agent films disposed between the plurality of connection units and the adhesive layer, the plurality of first release agent films and the plurality of connection units being in one-to-one correspondence. An orthographic projection of each connection unit on the stretchable base film is within an orthographic projection of a corresponding first release agent film on the stretchable base film. The plurality of display units are bonded to the adhesive layer.

20 Claims, 20 Drawing Sheets

ABSTRACT

FLEXIBLE DISPLAY PANEL AND MANUFACTURING METHOD THEREFOR, AND FLEXIBLE DISPLAY APPARATUS

CROSS-REFERENCE TO RELATED APPLICATION

This application is a national phase entry under 35 USC 371 of International Patent Application No. PCT/CN2019/099504 filed on Aug. 6, 2019, which is incorporated herein by reference in its entirety.

TECHNICAL FIELD

The present disclosure relates to the field of display technologies, and in particular, to a flexible display panel and a manufacturing method therefor, and a flexible display apparatus.

BACKGROUND

With the development of the flexible display technology, some flexible display panels are referred to as "stretchable flexible display panels" due to their good tensile properties.

SUMMARY

In one aspect, a flexible display panel is provided. The flexible display panel includes: a stretchable base film; an adhesive layer disposed on a surface of the stretchable base film; a flexible substrate including a plurality of display units and a plurality of connection units, every two adjacent display units being connected by at least one connection unit; and a plurality of first release agent films disposed between the plurality of connection units and the adhesive layer, the plurality of first release agent films and the plurality of connection units being in one-to-one correspondence. An orthographic projection of each connection unit on the stretchable base film is within an orthographic projection of a corresponding first release agent film on the stretchable base film. The plurality of display units are bonded to the adhesive layer.

In some embodiments, each first release agent film is formed on a surface of a corresponding connection unit facing the adhesive layer.

In some embodiments, each first release agent film is formed on a surface of the adhesive layer facing away from the stretchable base film.

In some embodiments, each display unit includes at least one connection portion that is connected in one-to-one correspondence to at least one connection unit corresponding to the display unit. The flexible display panel further includes at least one second release agent film. Each second release agent film is disposed between one of the at least one connection portion and the adhesive layer, and is connected to a first release agent film adjacent thereto.

In some embodiments, each second release agent film and the first release agent film adjacent thereto are an integral structure.

In some embodiments, a release force of each second release agent film on the adhesive layer is greater than a release force of the first release agent film adjacent thereto on the adhesive layer.

In some embodiments, the plurality of first release agent films include at least one type of an acrylic release agent film, a resin release agent film, an organic silicon release agent film, an alcohol release agent film, a fluorine-containing polyurethane release agent film, a fluorine-containing polysiloxane release agent film, a fluorosilicone release agent film, or a propane-butane release agent film.

In some embodiments, each display unit includes a first flexible base film, a driving circuit, and a light-emitting device that are disposed on the adhesive layer in sequence.

In some embodiments, each connection unit includes a second flexible base film and a connection circuit that are disposed on the adhesive layer in sequence.

In some embodiments, the flexible substrate further includes a thin film encapsulation layer disposed on a side of the plurality of connection units and the plurality of display units facing away from the adhesive layer.

In some embodiments, an orthographic projection of a portion of the thin film encapsulation layer corresponding to each connection unit is within the orthographic projection of the corresponding first release agent film.

In some embodiments, two ends of each connection unit connected to corresponding display units are bent, and bending directions of the two ends are opposite to each other.

In another aspect, a flexible display apparatus is provided. The flexible display apparatus includes the flexible display panel as described above, and a driving device configured to drive the flexible display panel.

In yet another aspect, a method of manufacturing a flexible display panel is provided. The method of manufacturing the flexible display panel includes: providing a stretchable base film, and forming an adhesive layer on a surface of the stretchable base film; manufacturing a flexible substrate including a plurality of display units and a plurality of connection units, every two adjacent display units being connected by at least one connection unit; forming a plurality of first release agent films on surfaces of the plurality of connection units that are on a same side as surfaces of the plurality of display units to be bonded with the adhesive layer, each connection unit being corresponding to one of the plurality of first release agent films; or, forming a plurality of first release agent films that are in one-to-one correspondence with the plurality of connection units on a surface of the adhesive layer facing away from the stretchable base film; and bonding the plurality of display units to the adhesive layer, an orthographic projection of each connection unit on the stretchable base film being within an orthographic projection of a corresponding first release agent film on the stretchable base film.

In some embodiments, in a case where the plurality of first release agent films are formed on the surfaces of the plurality of connection units that are on the same side as the surfaces of the plurality of display units to be bonded with the adhesive layer, before bonding the plurality of display units to the adhesive layer, the method further includes: forming at least one second release agent film on a surface of at least one connection portion of each display unit facing to the plurality of first release agent films, each second release agent film being connected to a first release agent film adjacent thereto.

In some embodiments, in a case where the plurality of first release agent films that are in one-to-one correspondence with the plurality of connection units are formed on the surface of the adhesive layer facing away from the stretchable base film, before bonding the plurality of display units to the adhesive layer, the method further includes:

forming at least one second release agent film that is in one-to-one correspondence with at least one connection portion of each display unit on the surface of the adhesive layer facing away from the stretchable base film, each second release agent film being connected to a first release agent film adjacent thereto.

In some embodiments, a method of forming the plurality of first release agent films includes at least one of a printing method or a spraying method.

In some embodiments, manufacturing the flexible substrate includes; providing a first support plate, and forming a flexible base layer and a display circuit layer on a surface of the first support plate in sequence; patterning the flexible base layer and the display circuit layer, to make the patterned flexible base layer include a plurality of first flexible base films and a plurality of second flexible base films, and to make the patterned display circuit layer include a plurality of driving circuits and a plurality of connection circuits; forming a light-emitting device on a side of each driving circuit facing away from the first support plate; and removing the first support plate. Each display unit of the plurality of display units includes one first flexible base film, one driving circuit, and one light-emitting device. Each connection unit includes one second flexible base film and one connection circuit.

In some embodiments, manufacturing the flexible substrate further includes: forming a thin film encapsulation layer on a side of the plurality of display units and the plurality of connection units facing away from the first support plate.

In some embodiments, before forming the plurality of first release agent films, the method further includes: bonding a temporary protective film and a second support plate to a side of the flexible substrate facing away from the first support plate in sequence. After bonding the plurality of display units to the adhesive layer, the method further includes: removing the temporary protective film and the second support plate.

BRIEF DESCRIPTION OF THE DRAWINGS

In order to explain technical solutions in embodiments of the present disclosure more clearly, the accompanying drawings to be used in descriptions of embodiments will be introduced briefly below. Obviously, the accompanying drawings to be described below are merely some embodiments of the present disclosure, a person of ordinary skill in the art may obtain other drawings according to these drawings.

DETAILED DESCRIPTION

Figure 1:
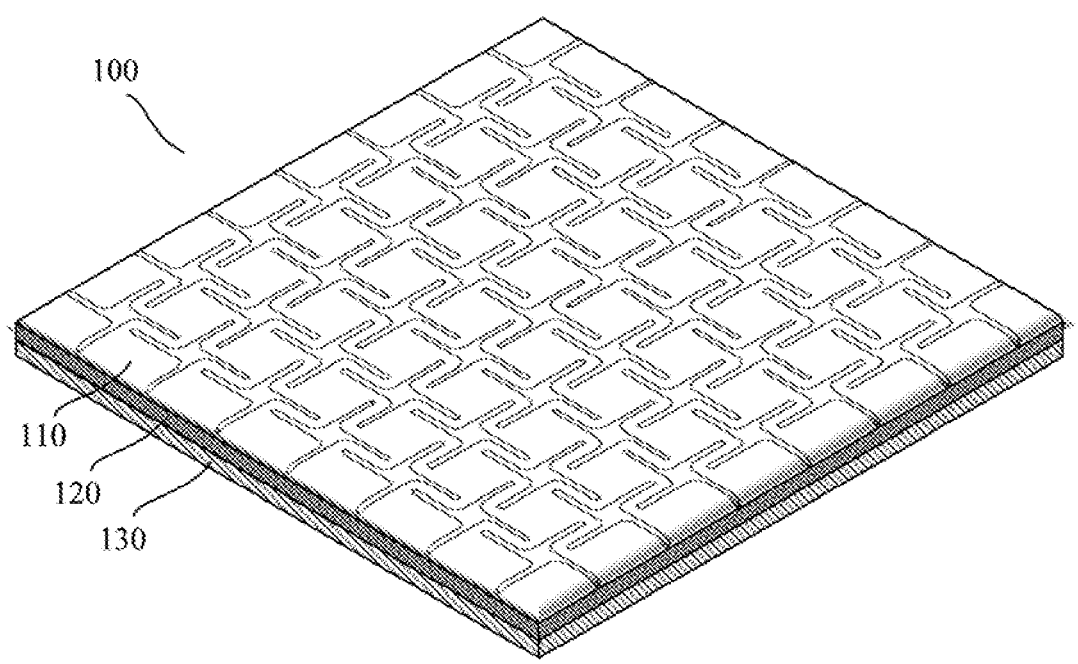
FIG. 1 is a schematic structure diagram of a flexible display panel, according to some embodiments of the present disclosure.
Figure 2:
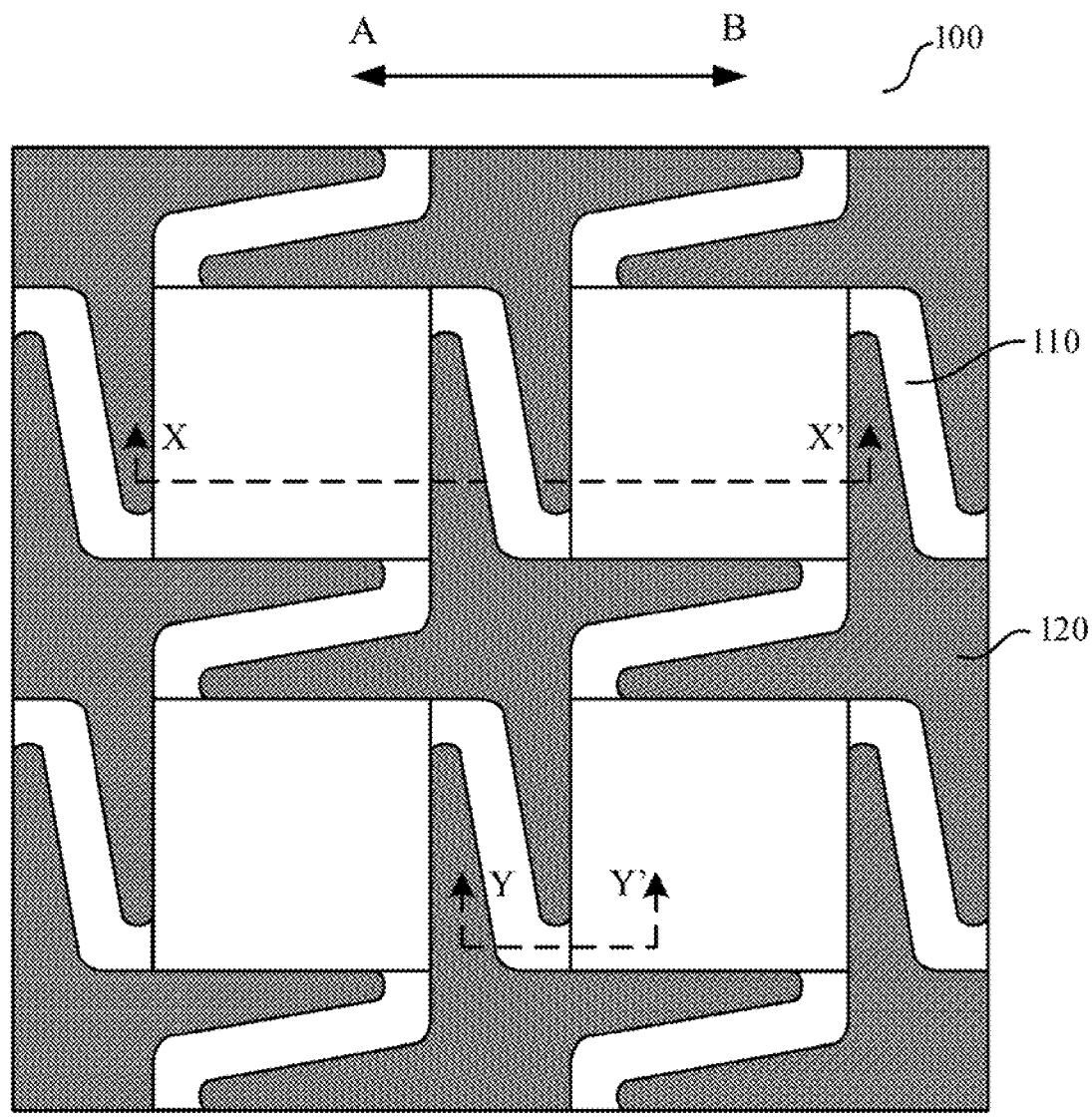
FIG. 2 is a partial top view showing a flexible display panel, according to some embodiments of the present disclosure.

Some embodiments of the present disclosure will be described below in combination with the accompanying drawings. Obviously, the embodiments to be described are merely some but not all of the embodiments of the present disclosure. All other embodiments obtained by a person of ordinary skill in the art on the basis of some embodiments of the present disclosure shall be included in the protection scope of the present disclosure.

The terms "first" and "second" are merely for illustrative purpose, and should not be interpreted as indicating or implying the relative importance or implicitly indicating the number of the indicated technical features. Therefore, the features defined by the terms "first" and "second" may explicitly or implicitly include one or more features. In the description of the embodiments of the present disclosure, the term "a/the plurality of" means two or more unless otherwise specified.

Referring to FIGS. 1 to 4, some embodiments of the present disclosure provide a flexible display panel 100. The flexible display panel 100 includes a flexible substrate 110, an adhesive layer 120, a stretchable base film 130, and a plurality of first release agent films 140.

The flexible substrate 110 includes a plurality of display units 1 and a plurality of connection units 2. Every two adjacent display units 1 are connected by at least one connection unit 2.

Herein, there is a space between every two adjacent display units 1 of the plurality of display units 1, and there is a space between every two adjacent connection units 2 of the plurality of connection units 2. Therefore, the flexible substrate 110 has a plurality of openings S formed due to the spaces. That is, the flexible substrate 110 has a certain hollow ratio, so that in a case where the flexible substrate 110 is stretched, it is easy for the flexible substrate 110 to be stretched along a stretching direction (e.g., direction AB in FIG. 3). Moreover, in the case where the flexible substrate 110 is stretched, the plurality of connection units 2 are twisted and deformed, which can increase a size of the openings S corresponding to the plurality of connection units 2 along the stretching direction. That is, a tensile stress in the flexible substrate 110 may be dispersed effectively. Therefore, the flexible substrate 110 as described above has good tensile properties.

The adhesive layer 120 is disposed on a surface of the stretchable base film 130, and the plurality of display units 1 are bonded to the adhesive layer 120. It can be seen that the flexible substrate 110 is bonded to the surface of the stretchable base film 130 by the adhesive layer 120. The stretchable base film 130 is able to fix the display units 1 of the flexible substrate 110 that is bonded thereon in a same plane, so as to ensure that the display units 1 are still able to be in the same plane when the flexible display panel 100 is in a stretched state. Therefore, a display phase difference caused by the display units 1 in different planes may be avoided. In this way, display inconsistencies in the display units 1 of the flexible display panel 100 may be reduced or even avoided, which is conducive to ensuring display effects of the flexible display panel.

The plurality of first release agent films are disposed between the plurality of connection units and the adhesive layer. The plurality of first release agent films and the plurality of connection units are in one-to-one correspondence, and an orthographic projection of each connection unit 2 of the plurality of connection units on the stretchable base film 130 is within an orthographic projection of a corresponding first release agent film 140 on the stretchable base film 130. That is to say, a surface of each connection unit 2 proximate to the adhesive layer 120 may be effectively separated from the adhesive layer 120 by the corresponding first release agent film 140, thereby ensuring that each connection unit 2 is not bonded to the adhesive layer 120. Since being not bonded to the adhesive layer 120, each connection unit 2 will not be bound, which is easy to increase a degree of freedom of each connection unit 2. In this way, a stress concentration of each connection unit 2 as a result of being bound by the adhesive layer 120 may be reduced, thereby avoiding a case that each connection unit 2 is damaged due to the stress when being stretched.

In this way, in the case where the flexible display panel 100 is in the stretched state, the plurality of display units 1 are still fixed in the same plane under a constraint of the adhesive layer 120, and the plurality of connection units 2 are able to be twisted and stretched freely. That is to say, a stretch reliability of the flexible display panel 100 as described above may be improved while ensuring the display effects thereof.

In addition, in the flexible display panel 100 provided by some embodiments of the present disclosure, the adhesive layer 120 and the stretchable base film 130 do not need to be patterned, which is conducive to reducing process steps of the flexible display panel 100 during the manufacturing process and the production cost of the flexible display panel 100.

Of course, since the adhesive layer 120 and the stretchable base film 130 do not need to be patterned, it may prevent the flexible display panel 100 from being defective due to patterning processes of the adhesive layer 120 and the stretchable base film 130 during the manufacturing process, which is conducive to improve a production yield of the flexible display panel.

For example, in a case where the patterning processes of the adhesive layer 120 and the stretchable base film 130 are completed by etching, after the flexible substrate 110 is bonded to the stretchable base film 130 by the adhesive layer 120, during a process of etching the stretchable base film 130 and the adhesive layer 120, if a plurality of light-emitting devices have been manufactured in the flexible substrate 110, the light-emitting devices are easily damaged due to the aforementioned etching process; and if the light-emitting devices have not been manufactured in the flexible substrate 110, after the aforementioned etching process is completed, the light-emitting devices need to be manufactured in the flexible substrate 110, which is easy to damage the stretchable base film 130 and the adhesive layer 120 due to a high temperature (greater than 400° C.) during a manufacturing process of the light-emitting devices.

For another example, in a case where the patterning processes of the adhesive layer 120 and the stretchable base film 130 are completed by laser cutting, a large amount of thermal energy generated by laser cutting may easily damage the stretchable base film 130, the adhesive layer 120, and the flexible substrate 110.

In the flexible display panel 100 provided by some embodiments of the present disclosure, the adhesive layer 120 and the stretchable base film 130 do not need to be patterned, which may avoid the foregoing situations effectively.

Herein, in some embodiments of the present disclosure, a type of the first release agent film 140 is not limited. For example, the plurality of first release agent films 140 include at least one type of an acrylic release agent film, a resin release agent film, an organic silicon release agent film, an alcohol release agent film, a fluorine-containing polyurethane release agent film, a fluorine-containing polysiloxane release agent film, a fluorosilicone release agent film, or a propane-butane release agent film.

In some embodiments of the present disclosure, a material of the stretchable base film 130 is not limited. For example, a material of the stretchable base film 130 is selected from at least one type of polydimethylsiloxane (abbreviated as PDMS), natural rubber, nitrile rubber, hydrogenated styrene-butadiene block copolymer (i.e., styrene ethylene butylene styrene, abbreviated as SEBS), thermoplastic polyurethanes (abbreviated as TPU), polyethylene naphthalate (abbreviated as PEN), polyimide (abbreviated as PI), polyetherimide (abbreviated as PEI), polyethylene terephthalate (abbreviated as PET), or polyphenylene sulfide (abbreviated as PPS). The above materials have good stretchability, so as to ensure that the stretchable base film 130 has good stretchability.

Each first release agent film 140 of the plurality of first release agent films 140 is located between the corresponding connection unit 2 and the adhesive layer 120. Each first release agent film 140 is formed on a surface of the corresponding connection unit 2 proximate to the adhesive layer 120, or each first release agent film 140 is formed on a surface of the adhesive layer 120 facing away from the stretchable base film 130, both of which are allowed. Some embodiments of the present disclosure do not limit this.

Figure 4:
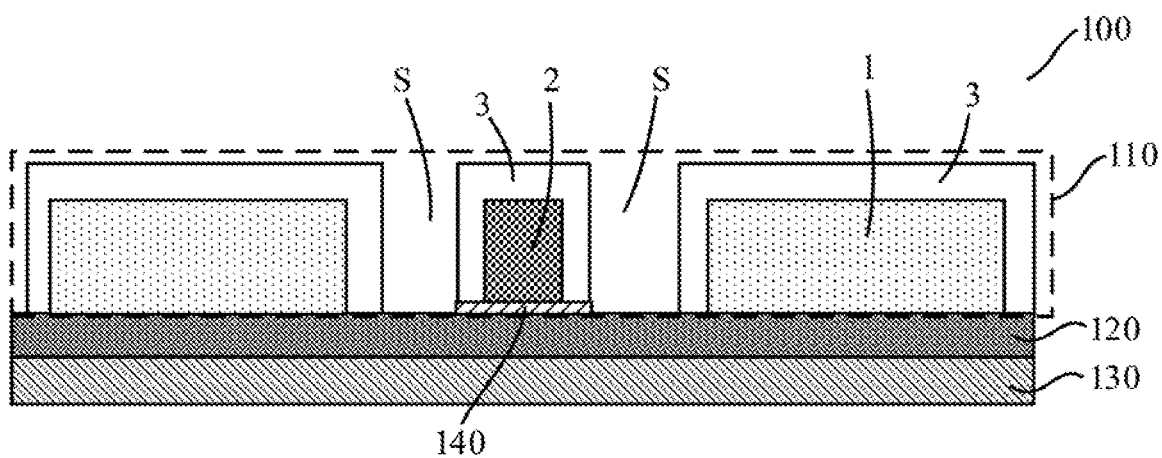
FIG. 4 is a sectional diagram of a flexible display panel taken along dotted line XX' in FIG. 2, according to some embodiments of the present disclosure.

In some embodiments, referring to FIG. 4, each first release agent film 140 is formed on the surface of the corresponding connection unit 2 proximate to the adhesive layer 120. In this way, since each first release agent film 140 is formed on the surface of the corresponding connection unit 2 proximate to the adhesive layer 120, the first release agent film 140 is able to move together with the corresponding connection unit 2. Thus, in the case where the flexible display panel 100 is in the stretched state, even if each connection unit 2 moves relative to the adhesive layer 120, there is still the first release agent film 140 between each connection unit 2 and the adhesive layer 120, which can prevent each connection unit 2 from being bonded to the adhesive layer 120. Therefore, it may ensure that the adhesive layer 120 has a small constraining force on each connection unit 2, thereby further reducing a probability of damage of each connection unit 2, and improving the stretch reliability of the flexible display panel 100.

In some other embodiments, each first release agent film 140 is formed on the surface of the adhesive layer 120 facing away from the stretchable base film 130. In this case, for example, to ensure that the orthographic projection of each connection unit 2 on the stretchable base film 130 is within the orthographic projection of the corresponding first release agent film 140 on the stretchable base film 130, the first release agent films 140 formed on the surface of the adhesive layer 120 may be aligned with the plurality of connection units 2.

Figure 5:
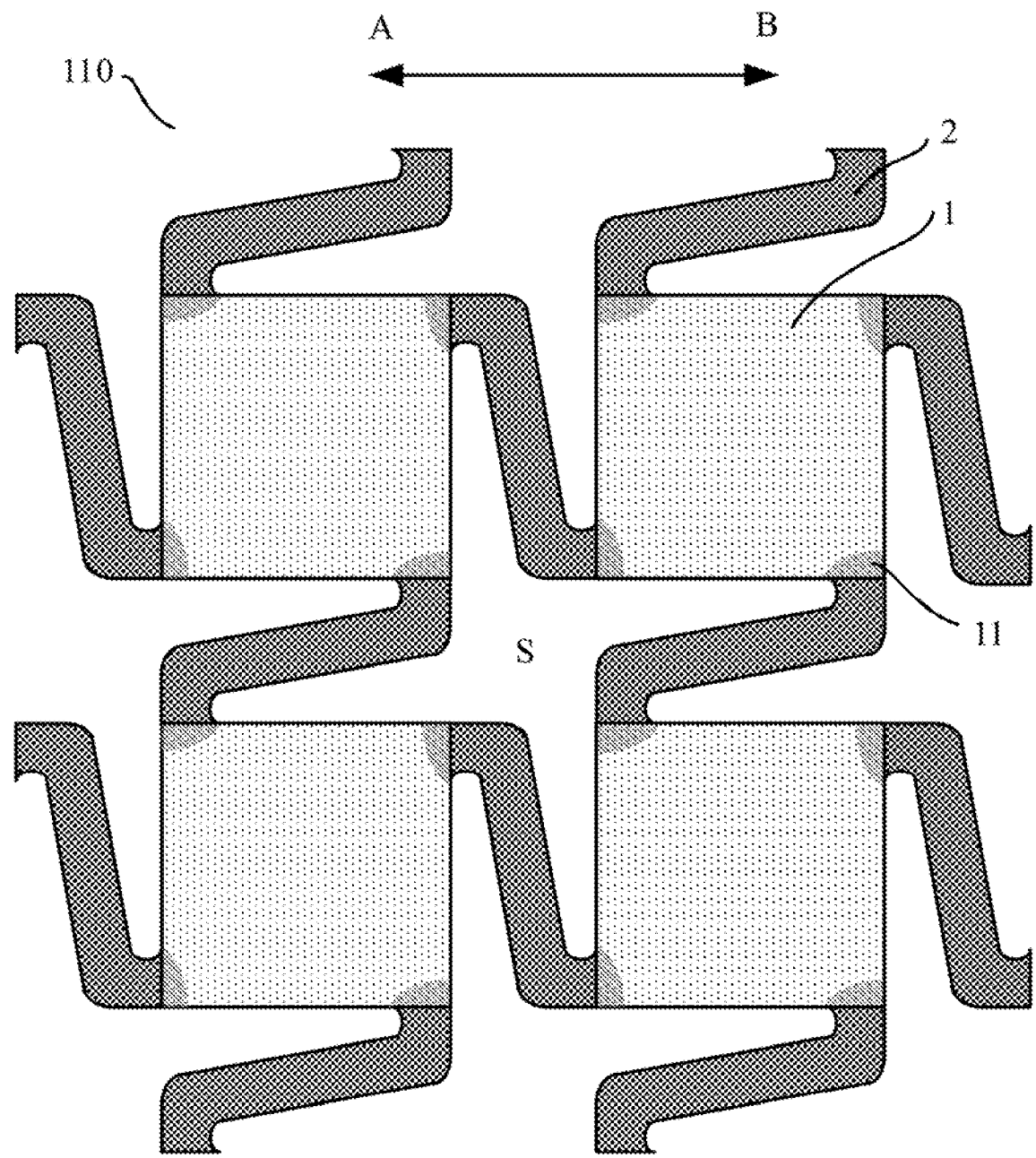
FIG. 5 is a partial top view showing a flexible substrate of another flexible display panel, according to some embodiments of the present disclosure.
Figure 6:
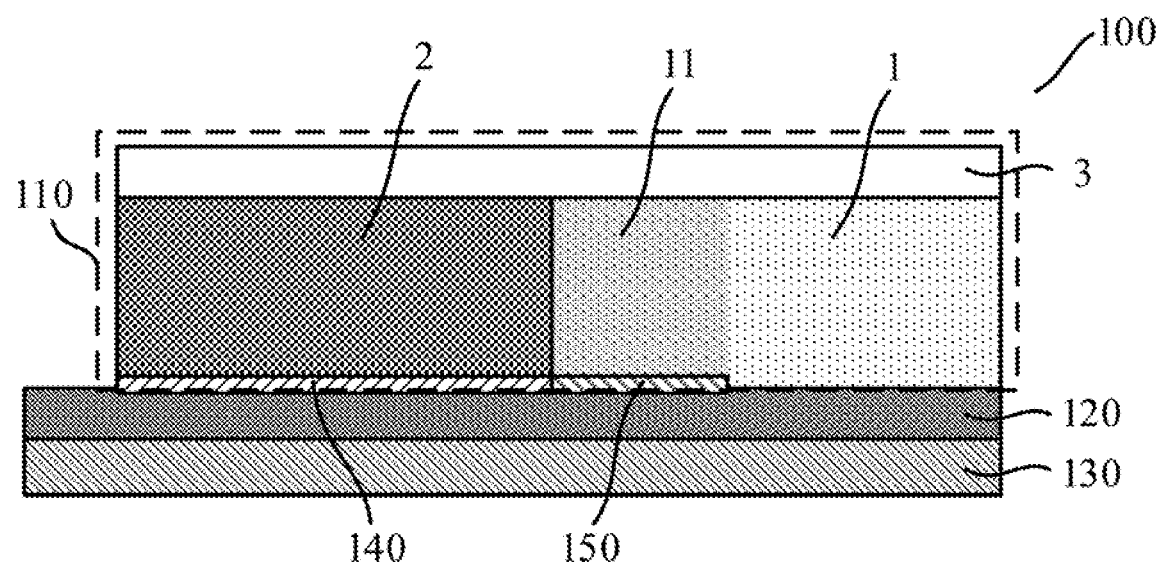
FIG. 6 is a sectional diagram of another flexible display panel taken along dotted line YY' in FIG. 2, according to some embodiments of the present disclosure.

In some embodiments of the present disclosure, referring to FIGS. 5 and 6, each display unit 1 of the plurality of display units includes at least one connection portion 11 that is connected to corresponding connection unit(s) 2 in one-to-one correspondence. The flexible display panel 100 further includes at least one second release agent film 150. Each second release agent film 150 of the at least one second release agent film is disposed between one connection portion 11 of the at least one connection portion and the adhesive layer 120, and each second release agent film 150 is connected to an adjacent first release agent film 140.

In this way, a constraining force of the adhesive layer 120 on each connection portion 11 provided with the second release agent film 150 is small, which increases a degree of rotational freedom of each connection portion 11 effectively. Therefore, in the case where the flexible display panel 100 is in the stretched state, the degree of rotational freedom of the connection unit 2 connected to each connection portion 11 is further increased, thereby further reducing the probability of damage of each connection unit 2, and improving the stretch reliability of the flexible display panel 100.

It will be noted that whether a material of the first release agent films 140 is the same as a material of the second release agent films 150 is not limited.

In some embodiments, the material of the first release agent films 140 and the material of the second release agent films 150 are the same. For example, referring to FIG. 6, each second release agent film 150 and the adjacent first release agent film 140 are an integral structure. Herein, each second release agent film 150 and the adjacent first release agent film 140 are made of a same material, and formed in a same process step. Therefore, a manufacturing process of the flexible display panel 100 may be simplified.

In some embodiments, the material of the first release agent films 140 and the material of the second release agent films 150 are different. For example, referring to FIG. 6, a release force of each second release agent film 150 on the adhesive layer 120 is greater than a release force of the adjacent first release agent film 140 on the adhesive layer 120.

Herein, it will be noted that the release force refers to a force required to separate a release agent film from the adhesive layer 120. It can be seen that compared with a separation from each second release agent film 150, the adhesive layer 120 is easier to separate from each first release agent film 140. That is to say, the constraining force of the adhesive layer 120 on each connection unit 2 is less than the constraining force of the adhesive layer 120 on each connection portion 11 provided with the second release agent film 150. Therefore, the constraining force of the adhesive layer 120 on each display unit 1 is greater than the constraining force of the adhesive layer 120 on the connection portion 11 of the display unit 1 provided with the second release agent film 150, and the constraining force of the adhesive layer 120 on the connection portion 11 is greater than the constraining force of the adhesive layer 120 on the connection unit 2 connected to this connection portion 11. That is, in each region of the flexible display panel 100 corresponding to each display unit 1 and a corresponding connection unit 2, from the display unit 1 to the corresponding connection unit 2, the constraining force on the region is progressively decreased, and a deformation of the region is progressively increased. Therefore, a degree of stress concentration due to a sudden increase in an amount of deformation can be reduced, thereby further reducing the probability of damage of each connection unit 2, and improving the stretch reliability of the flexible display panel 100.

Each display unit 1 and each connection unit 2 in the flexible display panel 100 as described above will be exemplarily introduced below.

Figure 7:
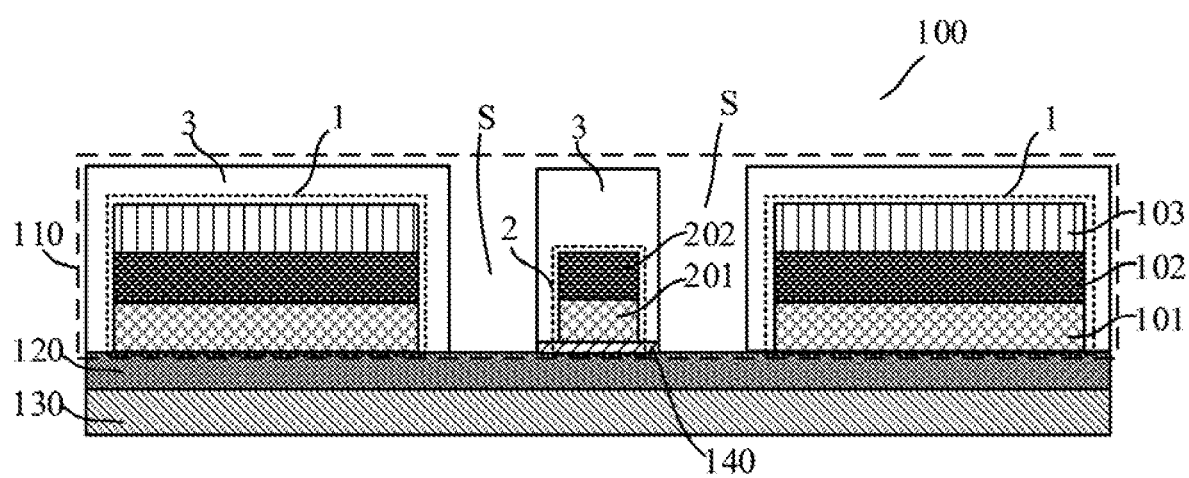
FIG. 7 is a sectional diagram of another flexible display panel taken along dotted line XX' in FIG. 2, according to some embodiments of the present disclosure.

In some embodiments, referring to FIG. 7, each display unit 1 includes a first flexible base film 101, a driving circuit 102, and a light-emitting device 103 that are arranged in sequence along a direction away from the adhesive layer 120. Each connection unit 2 includes a second flexible base film 201 and a connection circuit 202 that are arranged in sequence along a direction away from the adhesive layer 120.

For example, the first flexible base film 101 in each display unit 1 is directly bonded to the adhesive layer 120. A surface of the second flexible base film 201 in each connection unit 2 proximate to the stretchable base film is in indirect contact with the adhesive layer 120 by the corresponding first release agent film 140.

Herein, a relative positional relationship between the first flexible base film 101 included in each display unit 1 and the second flexible base film 201 included in each connection unit 2 is not limited. A relative positional relationship between the driving circuit 102 included in each display unit 1 and the connection circuit 202 included in each connection unit 2 is not limited.

For example, first flexible base films 101 and second flexible base films 201 are disposed in a same layer. In this case, the first flexible base films 101 and the second flexible base films 201 may be formed by a same process step, which simplifies the manufacturing process of the flexible display panel 100.

For another example, driving circuits 102 and connection circuits 202 are disposed in a same layer. In this case, the driving circuits 102 and the connection circuits 202 may be formed by a same process step, which simplifies the manufacturing process of the flexible display panel 100.

In addition, some embodiments of the present disclosure do not limit a material of the first flexible base films 101 and a material of the second flexible base films 201 as described above.

For example, the material of the first flexible base films 101 and the material of the second flexible base films 201 are selected from at least one type of polyimide, polyetherimide, polyethylene terephthalate, or polyphenylene sulfide.

It will be further noted that a type of the light-emitting device 103 as described above are not limited. For example, the light-emitting device 103 is an organic light-emitting diode (OLED) light-emitting device, a quantum dot light-emitting diode (QLED), a micro light-emitting diode (Micro LED), or other light-emitting devices.

In some embodiments of the present disclosure, the flexible substrate 110 further includes other layer(s) in addition to the plurality of display units 1 and the plurality of connection units 2. For example, referring to FIGS. 4, 6, 7, and 8, the flexible substrate 110 further includes a thin film encapsulation layer 3 disposed on a side of the plurality of display units 1 and the plurality of connection units 2 facing away from the adhesive layer 120. Herein, the thin film encapsulation layer 3 is able to prevent moisture and oxygen from intruding into the display units 1 and the connection units 2, and in particular, to prevent moisture and oxygen from corroding the light-emitting devices 103 inside the display units 1, and to extend a service life of the flexible display panel 100.

For example, a material of the thin film encapsulation layer 3 is at least one of silicon nitride, silicon oxide, aluminium oxide or silicon oxynitride.

Figure 8:
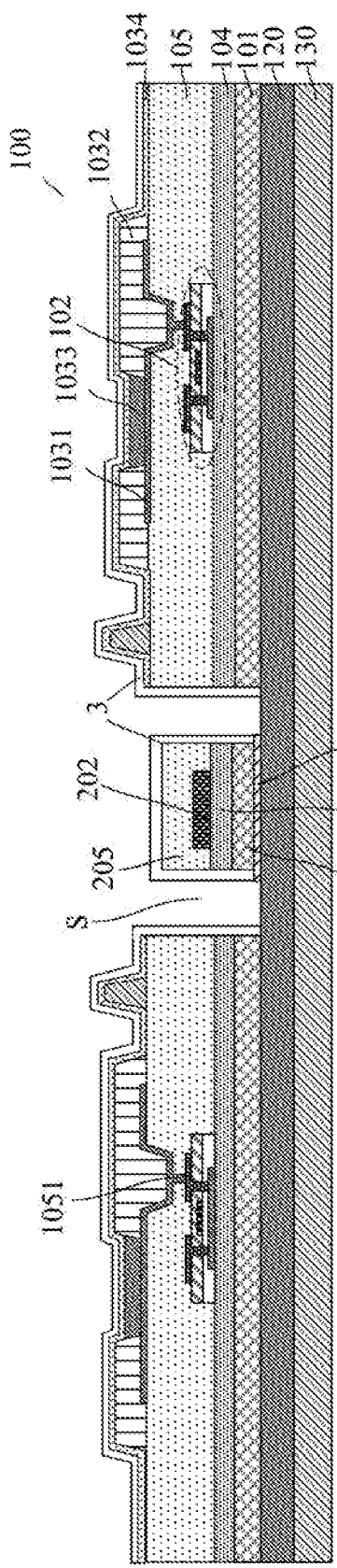
FIG. 8 is a sectional diagram of yet another flexible display panel taken along dotted line XX' in FIG. 2, according to some embodiments of the present disclosure.

In some embodiments, referring to FIGS. 4, 7, and 8, an orthographic projection of a portion of the thin film encapsulation layer 3 corresponding to each connection unit 2 is within the orthographic projection of the corresponding first release agent film 140. In this way, it can ensure that the portion of the thin film encapsulation layer 3 corresponding to each connection unit 2 is able to move with the corresponding connection unit 2, and to avoid constraining the connection unit 2 by reason that the thin film encapsulation layer 3 is bonded by the adhesive layer 120. Herein, the orthographic projection still refers to an orthographic projection of the thin film encapsulation layer 3 on the stretchable base film 130.

In addition, the portion of the thin film encapsulation layer 3 corresponding to each connection unit 2 refers to a portion of the thin film encapsulation layer 3 covering each connection unit 2. For example, referring to FIGS. 4, 6, 7 and 8 again, the thin film encapsulation layer 3 is disposed on the side of the plurality of display units 1 and the plurality of connection units 2 facing away from the adhesive layer 120. The thin film encapsulation layer 3 further covers each side face of each connection unit 2 and each side face of each display unit 1, and the side faces refer to surfaces of each connection unit 2 and each display unit 1 with interlayer gaps therebetween. In this case, the corresponding portion includes a portion of the thin film encapsulation layer 3 covering an upper surface of each connection unit 2 and a portion of the thin film encapsulation layer 3 covering each side face of the connection unit 2.

Herein, the thin film encapsulation layer 3 covers an upper surface and the side face of each display unit 1 and the upper surface and the side face of each connection unit 2, which can ensure that each display unit 1 and each connection unit 2 are in a relatively closed environment, and to avoid a permeation of moisture and oxygen from the interlayer gaps. Therefore, it can further prevent moisture and oxygen from corroding the light-emitting devices 103 in the display units 1, so as to enhance an encapsulating effect of the thin film encapsulation layer 3.

In some embodiments of the present disclosure, each display unit 1 and each connection unit 2 further include other layers. Hereinafter, the flexible display panel 100 will be exemplarily introduced in detail with reference to FIGS. 8 and 9.

In the flexible display panel 100, each display unit 1 includes a first flexible base film 101, a first buffer film 104, a driving circuit 102, a first planarization film 105, and a light-emitting device 103 that are arranged in sequence along a direction away from the adhesive layer 120. The first flexible base film 101 is disposed on a side of the adhesive layer 120 facing away from the stretchable base film 130.

Figure 9:
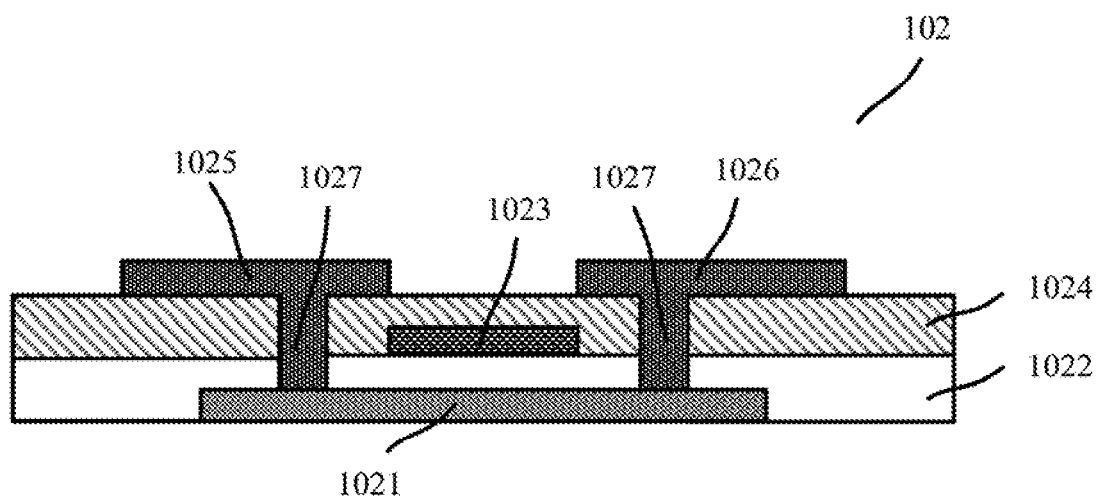
FIG. 9 is a schematic structure diagram of a driving circuit of the flexible display panel in FIG. 8.

Referring to FIG. 9, the driving circuit 102 includes an active layer 1021, a gate insulating layer 1022, a gate 1023, an interlayer insulating layer 1024, a source 1025 and a drain 1026. The gate insulating layer 1022 is disposed on a side of the active layer 1021. The gate 1023 is disposed on a side of the gate insulating layer 1022 facing away from the active layer 1021, and an orthographic projection of the gate 1023 on the active layer 1021 is within the active layer 1021. The interlayer insulating layer 1024 is disposed on a side of the gate 1023 and the gate insulating layer 1022 facing away from the active layer 1021, and covers the gate 1023. The source 1025 and the drain 1026 are disposed on a side of the interlayer insulating layer 1024 facing away from the active layer 1021. The gate insulating layer 1022 and the interlayer insulating layer 1024 are provided with two first vias 1027 penetrating therethrough, and the source 1025 and the drain 1026 are connected to the active layer 1021 by different first vias 1027, respectively.

The driving circuit 102 as shown in FIG. 9 includes at least one driving transistor. The at least one driving transistor has a structure that the gate 1023 is located on a side of the active layer 1021 facing away from the first flexible base film 101, and this structure is referred to as a "top gate" structure. It will be noted that the above example is described by taking the "top gate" structure as an example, which does not limit the technical solutions provided by the embodiments of the present disclosure. In another example, the at least one driving transistor included in the driving circuit 102 has a "bottom gate" structure or other structures. Herein, the "bottom gate" structure is that the gate 1023 is located on a side of the active layer 1021 facing the first flexible base film 101.

The light-emitting device 103 includes a first electrode 1031 a light-emitting layer (abbreviated as EML) 1033, and a second electrode 1034 that are stacked in sequence. The first electrode 1031 is disposed on a side of the first planarization film 105 facing away from the adhesive layer 120, and connected to the driving circuit 102 by a second via 1051 provided in the first planarization film 105.

It will be noted that, the first electrode 1031 and the second electrode 1034 may be only provided with the light-emitting layer 1033 therebetween, or provided with a plurality of other layers therebetween in addition to the light-emitting layer 1033, which is not limited herein. For example, the light-emitting device 103 further includes a hole injection layer and a hole transport layer that are stacked in sequence between the first electrode 1031 and the light-emitting layer 1033, and an electron transport layer and an electron injection layer that are stacked in sequence between the light-emitting layer 1033 and the second electrode 1034.

Herein, the first electrode 1031 of the light-emitting device 103 in each display unit 1 is an anode, and the anode is connected to the source 1025 or the drain 1026 in the driving circuit 102. Each display unit 1 further includes a pixel definition film 1032 disposed on the side of the first planarization film 105 facing away from the adhesive layer 120, and the pixel definition film 1032 has an opening. The light-emitting layer 1033 of the light-emitting device 103 in each display unit 1 is disposed in the opening of a corresponding pixel definition film 1032. The second electrode 1034 of the light-emitting device 103 in each display unit 1 is disposed on a side of the pixel definition film 1032 and the light-emitting layer 1033 facing away from the adhesive layer 120.

Each connection unit 2 includes a second flexible base film 201, a second buffer film 204, a connection circuit 202, and a second planarization film 205 that are arranged in sequence along a direction away from the adhesive layer 120. The second flexible base film 201 is disposed on the side of the adhesive layer 120 facing away from the stretchable base film 130.

Herein, it will be noted that since the sectional diagram shown by FIG. 8 is a sectional diagram of a portion of the flexible display panel 100, the connection circuit 202 is only shown in a form of a layer, and the layer represents a part of connection lines in the connection circuit 202, which does not limit the connection circuit 202. For example, the connection circuit 202 further includes at least one switching transistor.

In some embodiments, a shape of each connection unit 2 is configured to be non-linear, for example, to have at least one bending region, so as to improve the stretchability of each connection unit 2. In this way, in the case where the flexible display panel 100 is stretched, each connection unit 2 is able to be stretched to a certain extent in the at least one bending region, so that a distance between the two display units 1 connected by the connection unit 2 along the stretching direction is increased, which is conducive to the stretching of the flexible display panel 100.

Figure 3:
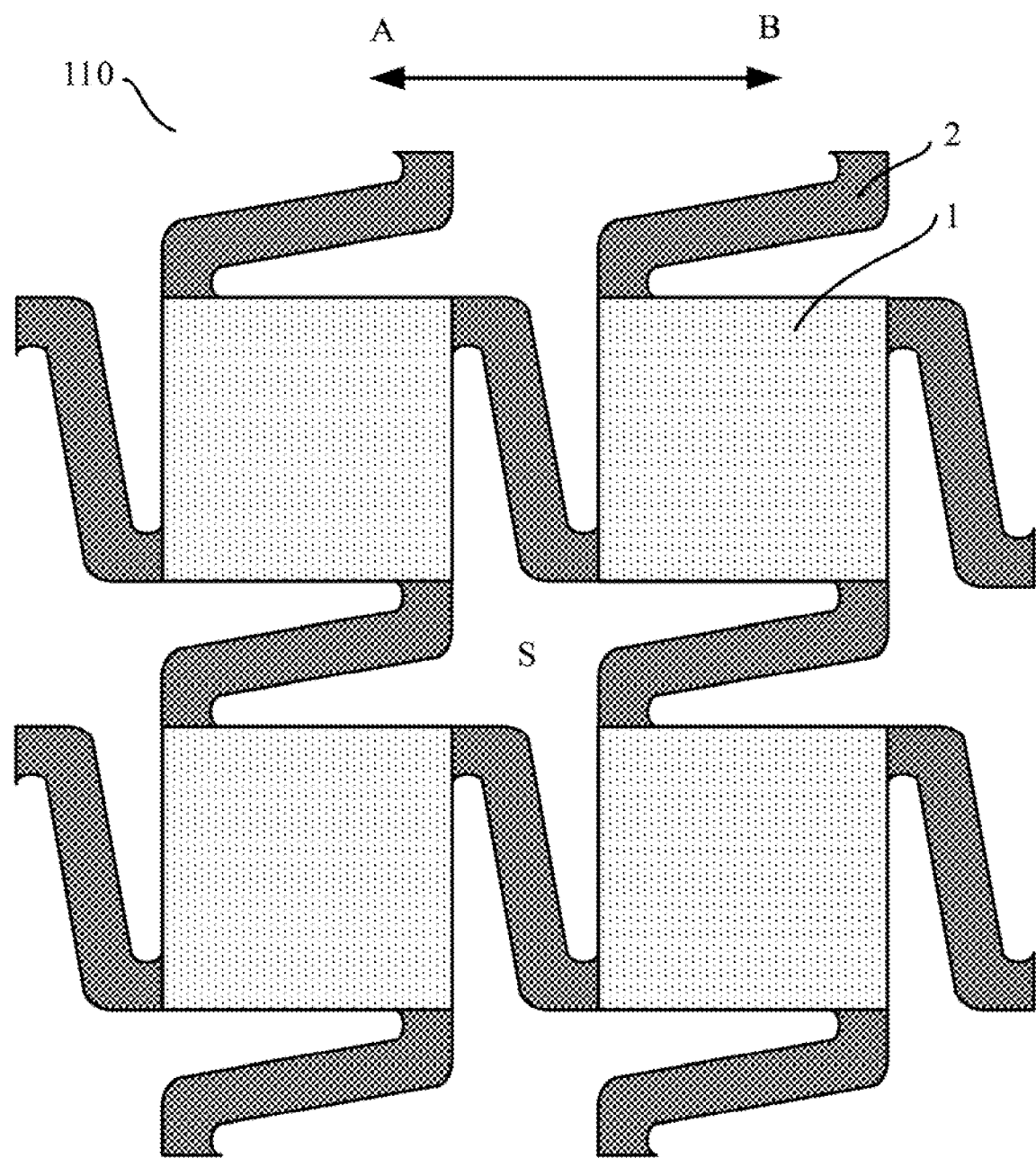
FIG. 3 is a partial top view showing a flexible substrate of the flexible display panel in FIG. 1.

For example, referring to FIGS. 3 and 5, two ends of each connection unit 2 connected to the corresponding display units 1 are bent, and bending directions of the two ends are opposite to each other. In this way, the ends of each connection unit 2 connected to the corresponding display units 1 each has a bending region as described above. Moreover, the bending directions of the two ends are opposite to each other, so that directions of stresses proximate to the two ends to which a portion of each connection unit 2 located between the two ends is subjected are opposite to each other. Therefore, it is more conducive to twisting for each connection unit 2, thereby further increasing the distance between the two display units 1 connected by the connection unit 2 along the stretching direction, so that the flexible display panel 100 is easy to be stretched along the stretching direction.

Figure 17:
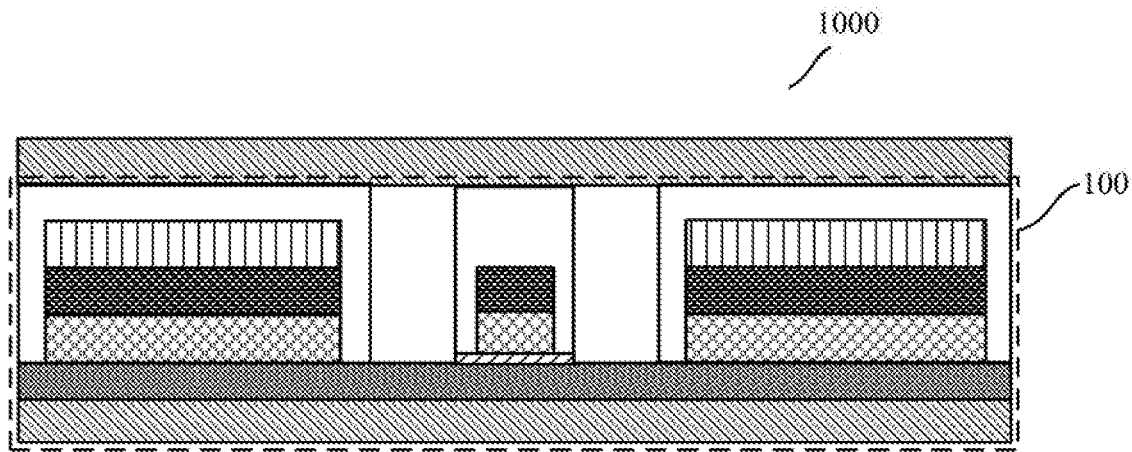
FIG. 17 is a schematic structure diagram of a flexible display apparatus, according to some embodiments of the present disclosure.

Some embodiments of the present disclosure provide a flexible display apparatus 1000. Referring to FIG. 17, the flexible display apparatus 1000 includes any one of the flexible display panels 100 as described above. The flexible display apparatus further includes a driving device for driving the flexible display panel, specifically including a driving circuit (not shown in the drawings).

The flexible display apparatus 1000 has the same beneficial effects as the flexible display panel 100 provided by the foregoing embodiments. Since the beneficial effects of the flexible display panel 100 have been described in detail in the foregoing embodiments, it will not be repeated herein.

Figure 10:
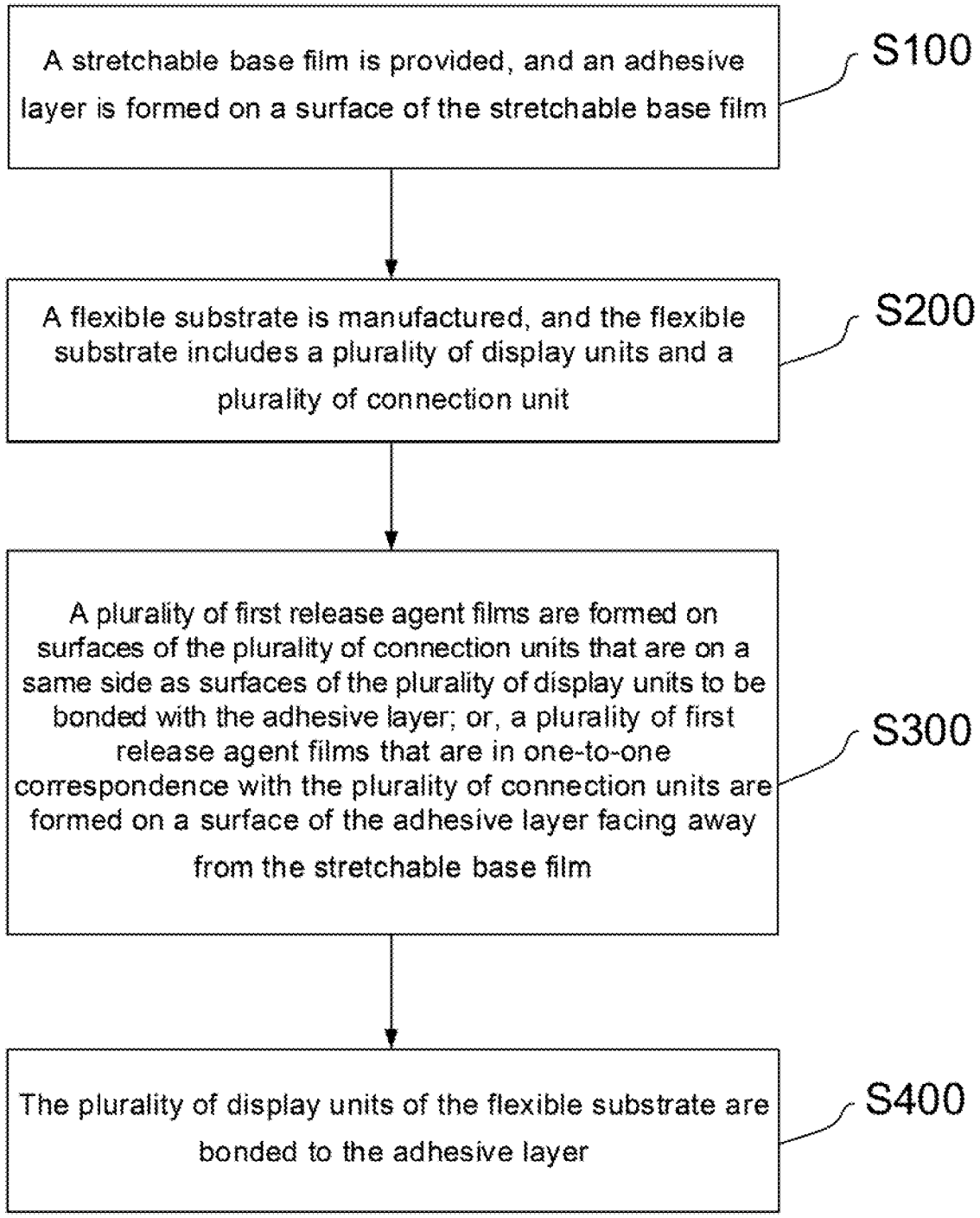
FIG. 10 is a flow chart of a method of manufacturing a flexible display panel, according to some embodiments of the present disclosure.

Some embodiments of the present disclosure provide a method of manufacturing a flexible display panel. Referring to FIG. 10, the method of manufacturing the flexible display panel includes S100 to S400.

In S100, a stretchable base film is provided, and an adhesive layer is formed on a surface of the stretchable base film.

In S200, a flexible substrate is manufactured. The flexible substrate includes a plurality of display units and a plurality of connection units, and every two adjacent display units are connected by at least one connection unit.

In S300, a plurality of first release agent films are formed on surfaces of the plurality of connection units that are on a same side as surfaces of the plurality of display units to be bonded with the adhesive layer. Or, a plurality of first release agent films that are in one-to-one correspondence with the plurality of connection units are formed on a surface of the adhesive layer facing away from the stretchable base film.

In S400, the plurality of display units of the flexible substrate are bonded to the adhesive layer. An orthographic projection of each connection unit of the flexible substrate on the stretchable base film is within an orthographic projection of the corresponding first release agent film on the stretchable base film.

Since the flexible display panel manufactured by the method has advantages of a high stretch reliability and a high yield while ensuring the display effects, the method of manufacturing the flexible display panel also has these advantages.

It will be noted that, in the method of manufacturing the flexible display panel as described above, since there is no mutual influence between forming the adhesive layer on the stretchable base film (i.e., S100) and manufacturing the flexible substrate (i.e., S200), and between forming the adhesive layer on the stretchable base film (i.e., S100) and forming the first release agent films (i.e., S300), S100 being performed before S400 is need to be only ensured, and an order between S100 and S200 and an order between S100 and S300 are not limited. For example, after the first release agent films are formed, the adhesive layer is formed on the stretchable base film. For example, forming the adhesive layer on the stretchable base film and manufacturing the flexible substrate are performed simultaneously. For another example, forming the first release agent films and forming the adhesive layer on the stretchable base film are performed simultaneously. Herein, it is not exhaustively listed.

It will be noted that, in S100, a method of forming the adhesive layer on the surface of the stretchable base film is not limited herein. For example, the stretchable base film is coated with preparation components for preparing the adhesive layer, for example, the components includes a copolymer monomer, a crosslinking agent, and an initiator, and then a curing process is performed on the coating preparation components, so that the preparation components are cured to form the adhesive layer on the stretchable base film. In another example, an adhesive layer finished product is obtained, and after being processed by cutting, aligning, etc., the adhesive layer finished product is pasted on the stretchable base film, to form the adhesive layer on a surface of the stretchable base film. It will be noted that the adhesive layer finished product herein refers to an independent adhesive layer that has been manufactured. For example, the adhesive layer finished product includes an adhesive layer body, an upper release film bonded to an upper surface of the adhesive layer body, and a lower release film bonded to a lower surface of the adhesive layer body. Herein, the upper release film and the lower release film are easy to peel off from the surfaces of the adhesive layer body without destroying a viscosity of the surfaces, and mainly serve to protect the viscosity of the surfaces.

For example, in S300, a method of forming the plurality of first release agent films includes at least one of a printing method or a spraying method. Herein, the printing method uses a liquid external release agent, for example, an acrylic release agent, a resin release agent, an organic silicone release agent, an alcohol release agent, a fluorine-containing polyurethane release agent, a fluorine-containing polysiloxane release agent, a fluorosilicone release agent, or the like. The spraying method uses a spray-type release agent, for example, a propane-butane release agent, or the like.

In some embodiments, in S300, forming the plurality of first release agent films includes the following steps.

In S301, a first release agent material is formed by a coating process, to form a plurality of release agent coating layers.

In S302, a leveling process is performed on the plurality of release agent coating layers, to form the plurality of first release agent films.

Herein, the leveling process in S302 serves to level the plurality of release agent coating layers, and to evaporate a solvent in the plurality of release agent coating layers in a certain time, thereby reducing a probability of pinholes and other defects in the plurality of release agent coating layers, and ensuring that the formed plurality of first release agent films are smooth.

Figure 11A:
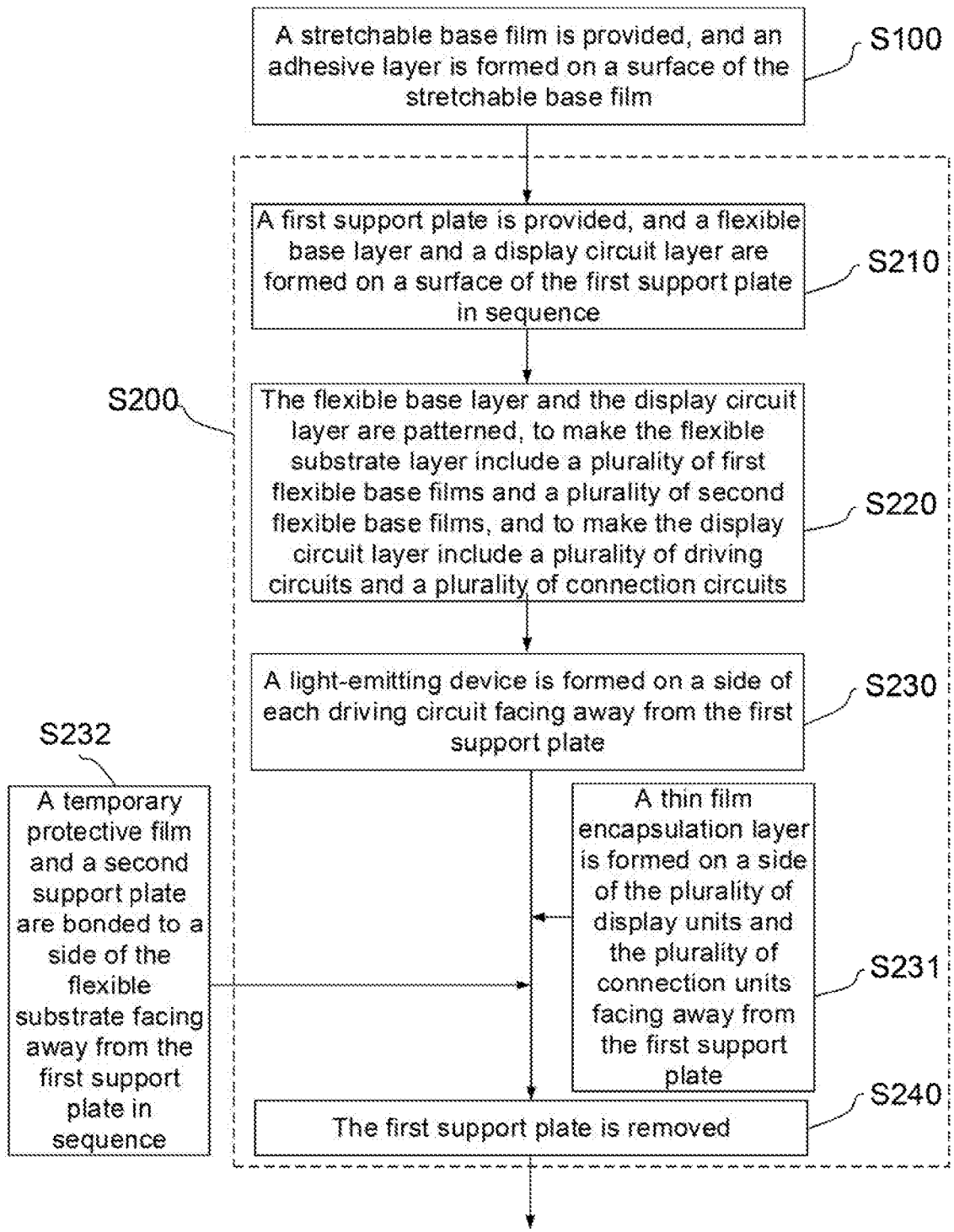
FIGS. 11A and 11B are two parts of a flow chart of a method of manufacturing another flexible display panel respectively, according to some embodiments of the present disclosure.

In some embodiments, referring to FIG. 11A, in S200, manufacturing the flexible substrate includes the following steps.

In S210, a first support plate is provided, and a flexible base layer and a display circuit layer are formed on a surface of the first support plate in sequence.

In S220, the flexible base layer and the display circuit layer are patterned, to make the patterned flexible base layer include a plurality of first flexible base films and a plurality of second flexible base films, and to make the patterned display circuit layer include a plurality of driving circuits and a plurality of connection circuits.

In S230, a light-emitting device is formed on a side of each driving circuit facing away from the first support plate.

In S240, the first support plate is removed. Each display unit of the flexible substrate includes one first flexible base film, one driving circuit, and one light-emitting device. Each connection unit of the flexible substrate includes one second flexible base film and one connection circuit.

For example, in a process of patterning the flexible base layer and the display circuit layer in S220, the patterning process used includes processes including a photolithography process and an etching process. The photolithography process refers to a process including a film formation (e.g., a film formation by chemical vapor deposition (abbreviated as CVD)), an exposure, a development and the like, and forming a pattern by using a photoresist, a mask, and an exposure machine, and the like.

For example, each light-emitting device formed in S230 is an OLED light-emitting device. In this case, a light-emitting layer in each light-emitting device may be formed by using of an inkjet printing process or an evaporation process.

In some embodiments, referring to FIG. 11A, in S200, manufacturing the flexible substrate further includes the following step.

In S231, a thin film encapsulation layer is formed on a side of the plurality of display units and the plurality of connection units facing away from the first support plate.

For example, referring to FIG. 11A, S231 is performed between S234 and S240 as described above, that is, after the light-emitting device is formed on the side of each driving circuit facing away from the first support plate, the thin film encapsulation layer is formed on the side of the plurality of display units and the plurality of connection units facing away from the first support plate, and then the first support plate is removed.

On this basis, in some embodiments, referring to FIG. 11A, before the first release agent films are formed, and after the thin film encapsulation layer is formed, the method of manufacturing the flexible display panel as described above further includes the following step.

In S232, a temporary protective film and a second support plate are bonded to a side of the flexible substrate facing away from the first support plate in sequence.

Figure 11B:
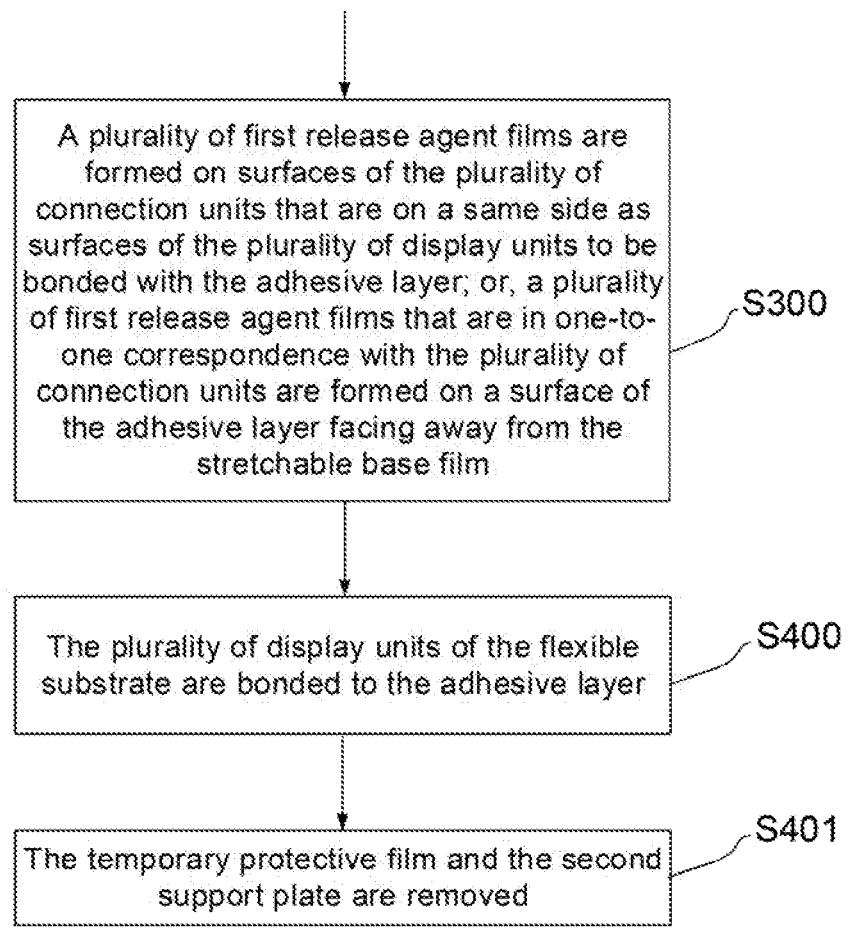

After the plurality of display units of the flexible substrate are bonded to the adhesive layer, referring to FIG. 11B, the method of manufacturing the flexible display panel further includes the following step.

In S401, the temporary protective film and the second support plate are removed.

Herein, the temporary protective film and the second support plate can protect the patterned flexible substrate from being damaged in a subsequent process of forming the first release agent films. For example, in a case where a layer of the flexible substrate bonded with the temporary protective film and the second support plate is the thin film encapsulation layer, during the subsequent process of forming the first release agent films, the temporary protective film and the second support plate can protect the thin film encapsulation layer.

It will be noted that an order between S232 and S240 is not limited herein.

For example, referring to FIG. 11A, S232 is performed between S231 and S240. That is, the thin film encapsulation layer is first formed on the side of the plurality of display units and the plurality of connection units facing away from the first support plate, and then the temporary protective film and the second support plate are bonded to the side of the flexible substrate facing away from the first support plate in sequence, and after that, the first support plate is removed. In this way, it can ensure that the flexible substrate is under protection of the support plates before being bonded to the stretchable base film.

Hereinafter, the method of manufacturing the flexible display panel as described above will be exemplarily described in detail with reference to FIGS. 12A to 12J.

Figure 12A:
FIGS. 12A to 12J are schematic diagrams of steps of a method of manufacturing a flexible display panel, according to some embodiments of the present disclosure, wherein FIG. 12H' is a schematic diagram of an alternative step paratactic with a step shown in FIG. 12H.

Referring to FIG. 12A, S100 is performed, that is, the stretchable base film 130 is provided, and the adhesive layer 120 is formed on the surface of the stretchable base film 130.

The flexible substrate 110 is manufactured (i.e., S200), and a manufacturing process is shown in FIGS. 12B to 12E.

Figure 12B:
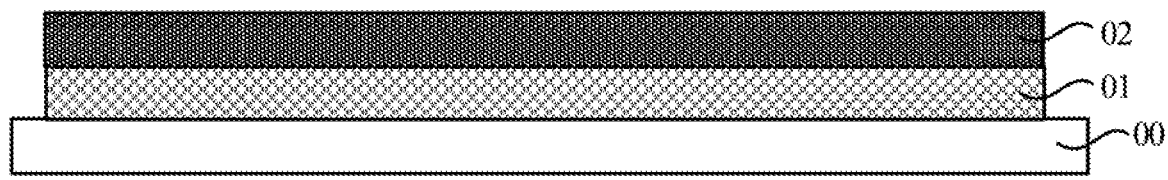

Referring to FIG. 12B, S210 is performed. That is, the first support plate 00 is provided, and the flexible base layer 01 and the display circuit layer 02 are formed on the side surface of the first support plate 00 in sequence.

Figure 12C:
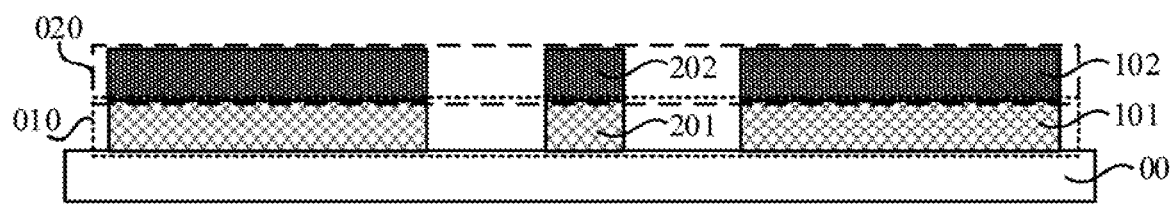

Referring to FIG. 12C, S220 is performed. That is, the flexible base layer 01 and the display circuit layer 02 are patterned to obtain the patterned flexible base layer 010 and the patterned display circuit layer 020. The patterned flexible base layer 010 includes the plurality of first flexible base films 101 and the plurality of second flexible base films 201, and the patterned display circuit layer 020 includes the plurality of driving circuits 102 and the plurality of connection circuits 202.

Figure 12D:
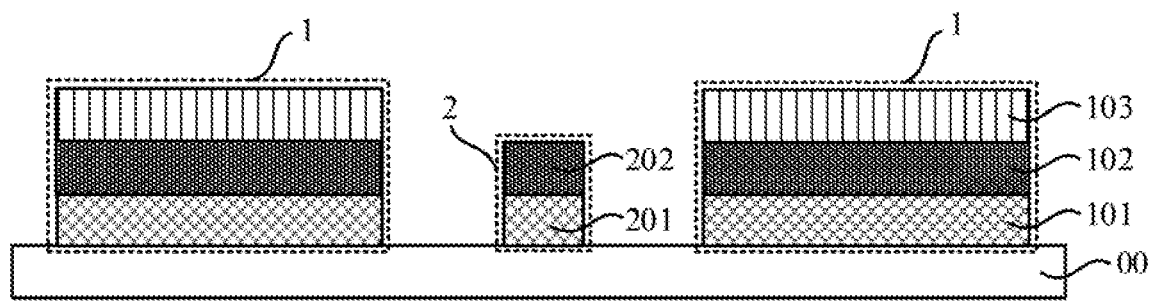

Referring to FIG. 12D, S230 is performed. That is, the light-emitting device 103 is formed on the side of each driving circuit 102 facing away from the first support plate 00. In this way, the plurality of display units 1 and the plurality of connection units 2 are formed. Each display unit 1 includes one first flexible base film 101, one driving circuit 102, and one light-emitting device 103. Each connection unit 2 includes one second flexible base film 201 and one connection circuit 202.

Figure 12E:
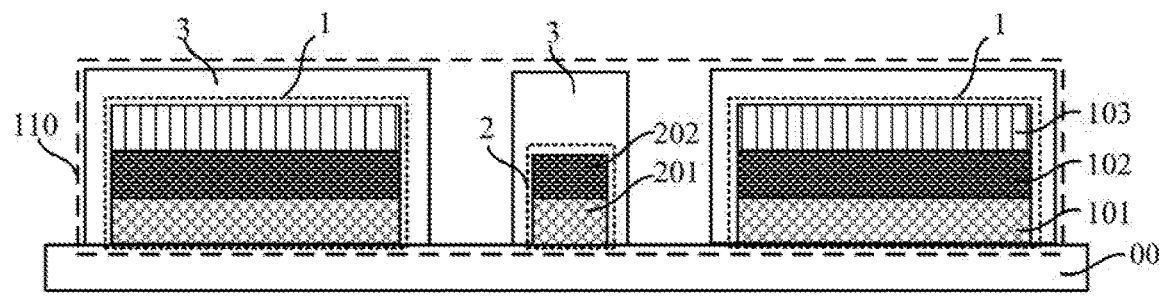

Referring to FIG. 12E, S231 is performed. That is, the thin film encapsulation layer 3 is formed on the side of the plurality of display units 1 and the plurality of connection units 2 facing away from the first support plate 00.

In this way, the flexible substrate 110 is formed.

It will be noted that an order between forming the adhesive layer 120 on the side surface of the stretchable base film 130 (i.e., S100) and manufacturing the flexible substrate 110 (i.e., S200) is not limited.

Figure 12F:
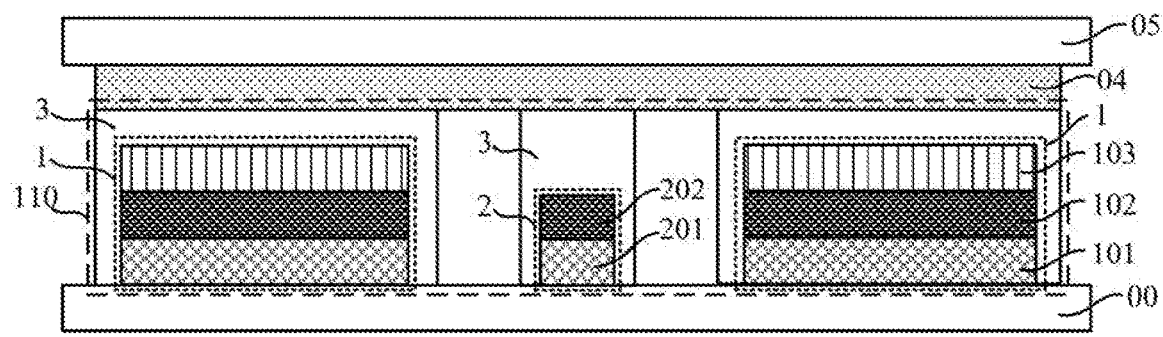

After the flexible substrate 110 is manufactured, referring to FIG. 12F, S232 is performed. That is, the temporary protective film 04 and the second support plate 05 are bonded to the side of the flexible substrate 110 facing away from the first support plate 00 in sequence.

It will be noted that the temporary protective film 04 and the second support plate 05 can protect the surface of the flexible substrate 110 facing away from the first support plate 00. For example, in a case where the surface is a surface of the thin film encapsulation layer 3, the temporary protective film 04 and the second support plate 05 can protect the thin film encapsulation layer 3 from being damaged during a subsequent manufacturing process.

Figure 12G:
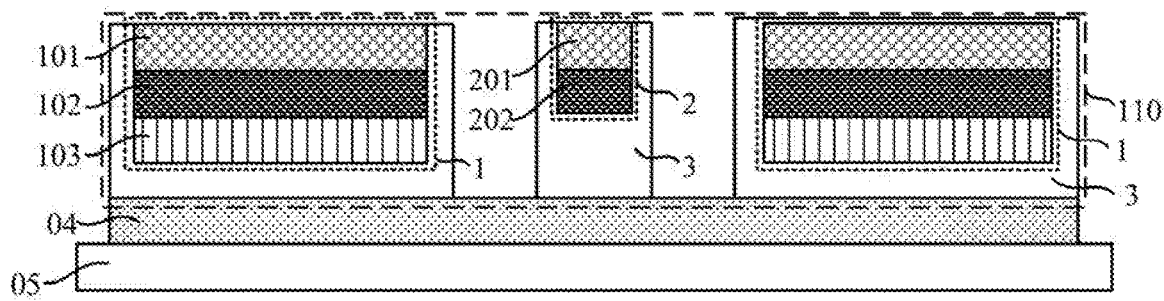

After the temporary protective film 04 and the second support plate 05 are bonded to the flexible substrate, referring to FIG. 12G. S240 is performed. That is, the first support plate 00 is removed.

The plurality of first release agent films 140 are manufactured. It will be noted that there are many possible ways to manufacture the plurality of first release agent films 140 in the embodiments of the present disclosure.

Figure 12H:
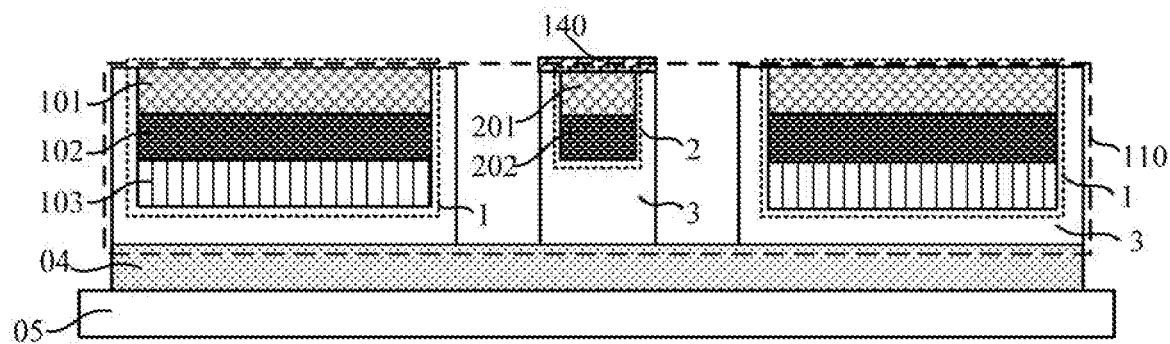
Figure 12H:
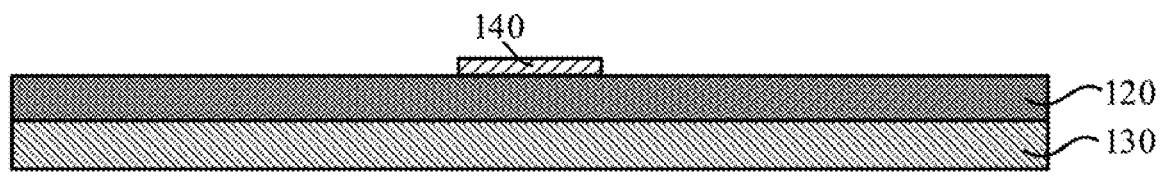

For example, FIG. 12H is referenced.

S300A is performed. That is, the plurality of first release agent films 140 are formed on the surfaces of the plurality of connection units 2 that are on the same side as the surfaces of the plurality of display units 1 to be bonded with the adhesive layer. Herein, since one first release agent film 140 is formed on a surface of each connection unit 2 that is on the same side as the surfaces of the plurality of display units 1 to be bonded with the adhesive layer, as shown in FIG. 12H, the second support plate 05 faces downward, and a corresponding surface of each display unit 1 faces upward, it is convenient for the first release agent film 140 to be formed on each connection unit 2.

In another example, FIG. 12H' is referenced.

S300B is performed. That is, the plurality of first release agent films 140 that are in one-to-one correspondence with the plurality of connection units are formed on the surface of the adhesive layer 120 facing away from the stretchable base film 130.

In this way, the plurality of first release agent films 140 are formed.

Figure 12I:
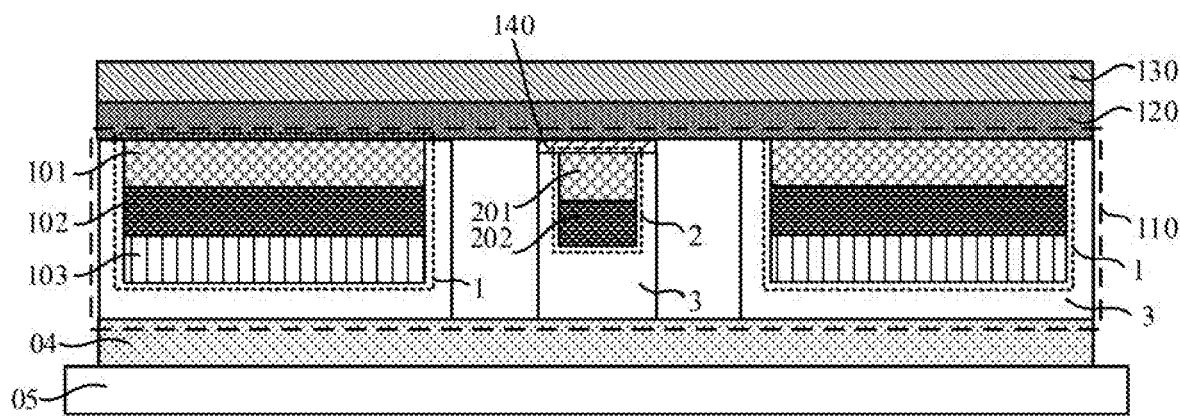

Referring to FIG. 12I, S400 is performed. That is, the plurality of display units 1 of the flexible substrate 110 are bonded to the adhesive layer 120. The orthographic projection of each connection unit 2 of the flexible substrate 110 on the stretchable base film 130 is within the orthographic projection of the corresponding first release agent film 140 on the stretchable base film 130.

Figure 12J:
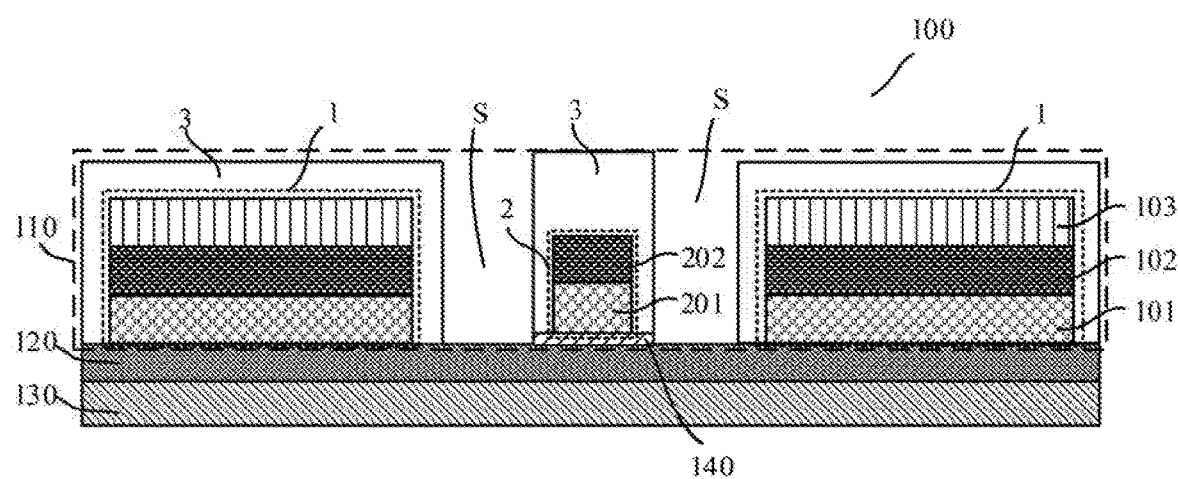

Referring to FIG. 12J, S401 is performed. That is, the temporary protective film 04 and the second support plate 05 are removed.

In this way, the flexible display panel 100 is obtained.

Figure 13:
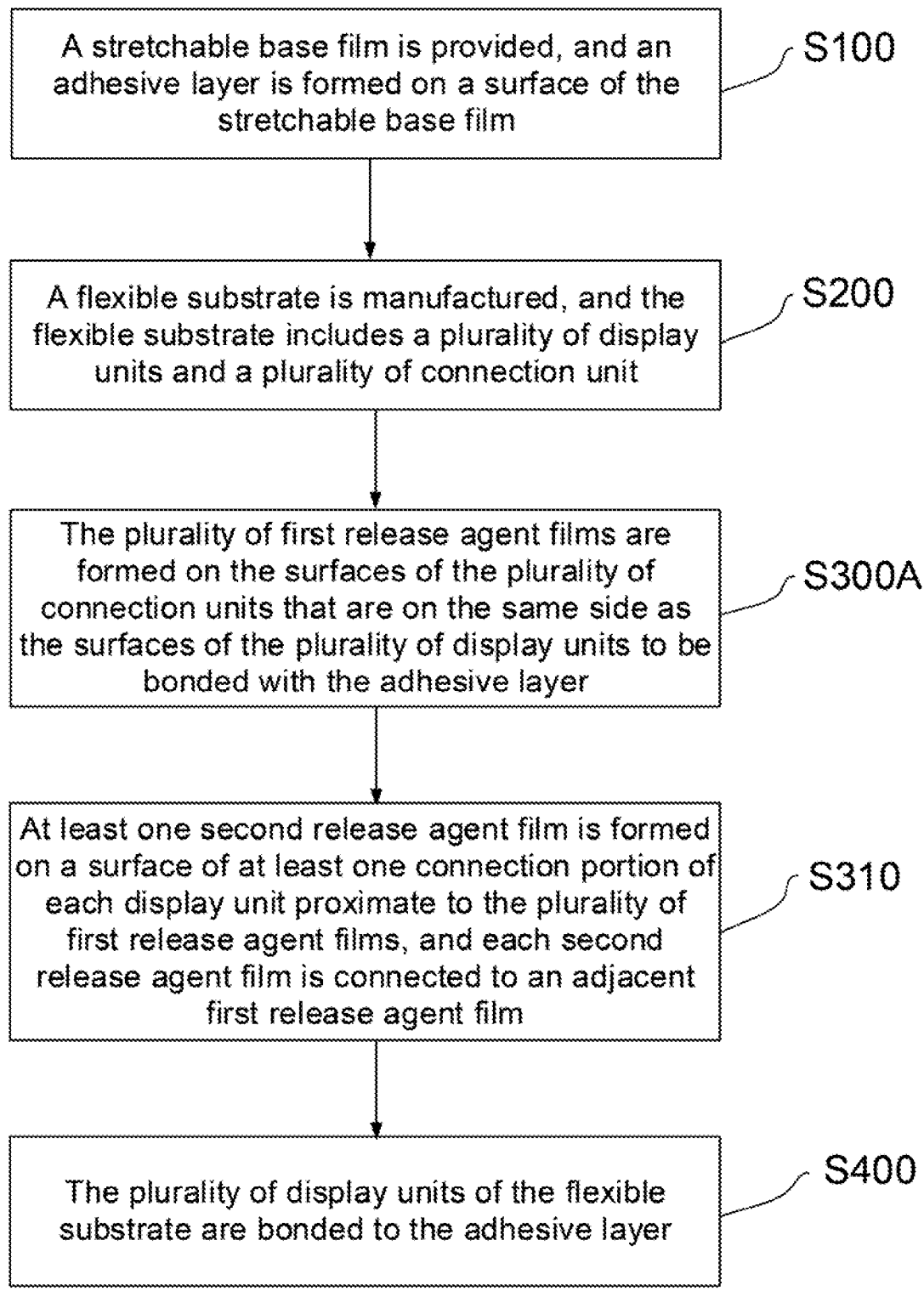
FIG. 13 is a flow chart of a method of manufacturing yet another flexible display panel, according to some embodiments of the present disclosure.
Figure 14:
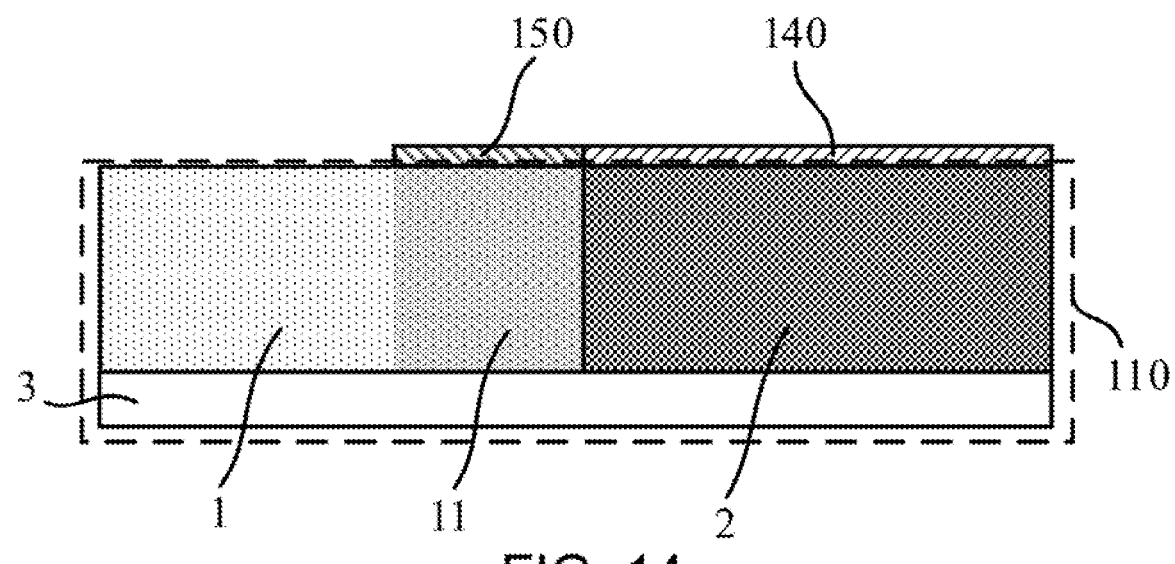
FIG. 14 is a schematic diagram of S310 in the method of manufacturing the flexible display panel in FIG. 13.

In some embodiments, referring to FIG. 6, each first release agent film 140 is formed on the surface of the corresponding connection unit 2 proximate to the adhesive layer 120. That is, in a case where the plurality of first release agent films 140 are formed on the surfaces of the plurality of connection units 2 that are on the same side as the surfaces of the plurality of display units 1 to be bonded with the adhesive layer 120, referring to FIGS. 13 and 14, before the plurality of display units 1 of the flexible substrate 110 are bonded to the adhesive layer 120 (i.e., S400), the method of manufacturing the flexible display panel as described above further includes the following step.

In S310, at least one second release agent film 150 is formed on a surface of at least one connection portion 11 of each display unit 1 proximate to the plurality of first release agent films 140, and each second release agent film 150 of the at least one second release agent film 150 is connected to an adjacent first release agent film 140.

Figure 15:
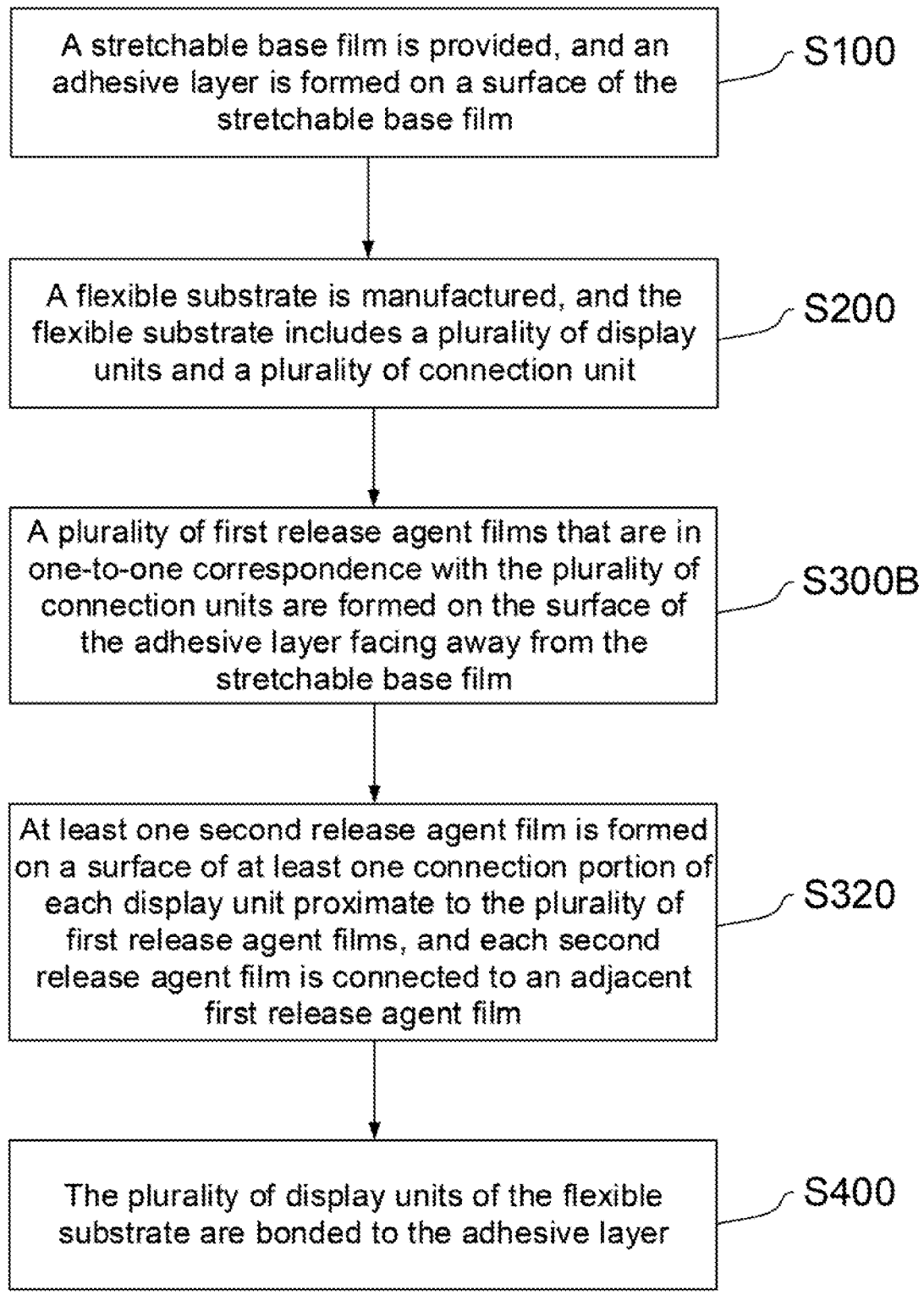
FIG. 15 is a flow chart of a method of manufacturing yet another flexible display panel, according to some embodiments of the present disclosure.
Figure 16:
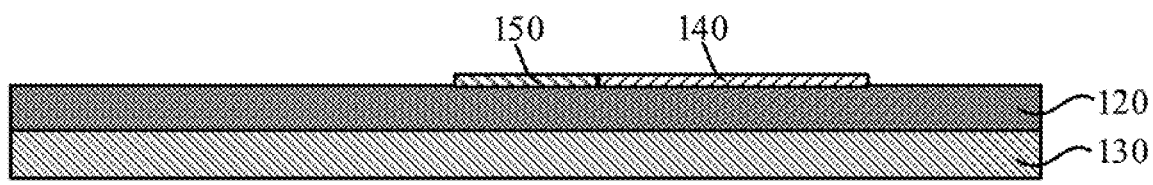
FIG. 16 is a schematic diagram of S320 in the method of manufacturing the flexible display panel in FIG. 15.

In some other embodiments, referring to FIG. 6, each first release agent film 140 is formed on the surface of the adhesive layer 120 facing away from the stretchable base film 130. That is, in a case where the plurality of first release agent films 140 that are in one-to-one correspondence with the plurality of connection units 2 are formed on the surface of the adhesive layer 120 facing away from the stretchable base film 130, referring to FIGS. 15 and 16, before the plurality of display units 1 of the flexible substrate 110 are bonded to the adhesive layer 120 (i.e., S400), the method of manufacturing the flexible display panel as described above further includes the following step.

In S320, at least one second release agent film 150 that are in one-to-one correspondence with the at least one connection portion 11 of each display unit 1 is formed on the surface of the adhesive layer 120 facing away from the stretchable base film 130, and each second release agent film 150 of the at least one second release agent film 150 is connected to an adjacent first release agent film 140.

Herein, since each second release agent film 150 is connected to the adjacent first release agent film 140, in some embodiments of the present disclosure, each second release agent film 150 and the adjacent first release agent film 140 may be formed in a same process step by an integrated forming process.

In some other embodiments of the present disclosure, the first release agent films 140 are formed in a process step, and the second release agent films 150 are formed in another process step. In this case, for example, a material of manufacturing the first release agent films 140 is different from a material of manufacturing the second release agent films 150. For example, the material of the first release agent films 140 is a release agent material with a small release force after film formation, and the material of the second release agent films 150 is a release agent material with a large release force after film formation.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flexible display panel, comprising:
   a stretchable base film;
   an adhesive layer disposed on a surface of the stretchable base film;
   a flexible substrate including a plurality of display units and a plurality of connection units, every two adjacent display units being connected by at least one connection unit; and
   a plurality of first release agent films disposed between the plurality of connection units and the adhesive layer, the plurality of first release agent films and the plurality of connection units being in one-to-one correspondence; wherein an orthographic projection of each connection unit on the stretchable base film is within an orthographic projection of a corresponding first release agent film on the stretchable base film; and the plurality of display units are bonded to the adhesive layer.

2. The flexible display panel according to claim 1, wherein each first release agent film is formed on a surface of a corresponding connection unit facing the adhesive layer.

3. The flexible display panel according to claim 1, wherein each first release agent film is formed on a surface of the adhesive layer facing away from the stretchable base film.

4. The flexible display panel according to claim 1, wherein each display unit includes at least one connection portion that is connected in one-to-one correspondence to at least one connection unit corresponding to the display unit;

the flexible display panel further comprises:
at least one second release agent film, each second release agent film being disposed between one of the at least one connection portion and the adhesive layer, and being connected to a first release agent film adjacent thereto.

5. The flexible display panel according to claim 4, wherein each second release agent film and the first release agent film adjacent thereto are an integral structure.

6. The flexible display panel according to claim 4, wherein a release force of each second release agent film on the adhesive layer is greater than a release force of the first release agent film adjacent thereto on the adhesive layer.

7. The flexible display panel according to claim 1, wherein the plurality of first release agent films include at least one type of an acrylic release agent film, a resin release agent film, an organic silicon release agent film, an alcohol release agent film, a fluorine-containing polyurethane release agent film, a fluorine-containing polysiloxane release agent film, a fluorosilicone release agent film, or a propane-butane release agent film.

8. The flexible display panel according to claim 1, wherein each display unit includes a first flexible base film, a driving circuit, and a light-emitting device that are disposed on the adhesive layer in sequence.

9. The flexible display panel according to claim 1, wherein each connection unit includes a second flexible base film and a connection circuit that are disposed on the adhesive layer in sequence.

10. The flexible display panel according to claim 1, wherein the flexible substrate further includes a thin film encapsulation layer disposed on a side of the plurality of connection units and the plurality of display units facing away from the adhesive layer.

11. The flexible display panel according to claim 10, wherein an orthographic projection of a portion of the thin film encapsulation layer corresponding to each connection unit is within the orthographic projection of the corresponding first release agent film.

12. The flexible display panel according to claim 1, wherein two ends of each connection unit connected to corresponding display units are bent, and bending directions of the two ends are opposite to each other.

13. A flexible display apparatus, comprising the flexible display panel according to claim 1, and a driving device configured to drive the flexible display panel.

14. A method of manufacturing a flexible display panel, comprising:

providing a stretchable base film, and forming an adhesive layer on a surface of the stretchable base film;

manufacturing a flexible substrate including a plurality of display units and a plurality of connection units, every two adjacent display units being connected by at least one connection unit;

forming a plurality of first release agent films on surfaces of the plurality of connection units that are on a same side as surfaces of the plurality of display units to be bonded with the adhesive layer, each connection unit being corresponding to one of the plurality of first release agent films; or, forming a plurality of first release agent films that are in one-to-one correspondence with the plurality of connection units on a surface of the adhesive layer facing away from the stretchable base film; and bonding the plurality of display units to the adhesive layer, an orthographic projection of each connection unit on the stretchable base film being within an orthographic projection of a corresponding first release agent film on the stretchable base film.

15. The method according to claim 14, in a case where the plurality of first release agent films are formed on the surfaces of the plurality of connection units that are on the same side as the surfaces of the plurality of display units to be bonded with the adhesive layer, before bonding the plurality of display units to the adhesive layer, the method further comprising:

forming at least one second release agent film on a surface of at least one connection portion of each display unit facing the plurality of first release agent films, each second release agent film being connected to a first release agent film adjacent thereto.

16. The method according to claim 14, in a case where the plurality of first release agent films that are in one-to-one correspondence with the plurality of connection units are formed on the surface of the adhesive layer facing away from the stretchable base film, before bonding the plurality of display units to the adhesive layer, the method further comprising:

forming at least one second release agent film that is in one-to-one correspondence with at least one connection portion of each display unit on the surface of the adhesive layer facing away from the stretchable base film, each second release agent film of being connected to a first release agent film adjacent thereto.

17. The method according to claim 14, wherein a method of forming the plurality of first release agent films includes at least one of a printing method or a spraying method.

18. The method according to claim 14, wherein manufacturing the flexible substrate includes:

providing a first support plate, and forming a flexible base layer and a display circuit layer on a surface of the first support plate in sequence;

patterning the flexible base layer and the display circuit layer, to make the patterned flexible base layer include a plurality of first flexible base films and a plurality of second flexible base films, and to make the patterned display circuit layer include a plurality of driving circuits and a plurality of connection circuits;

forming a light-emitting device on a side of each driving circuit facing away from the first support plate; and removing the first support plate; wherein
each display unit includes one first flexible base film, one driving circuit, and one light-emitting device, and each connection unit includes one second flexible base film and one connection circuit.

19. The method according to claim 18, wherein manufacturing the flexible substrate further includes:
forming a thin film encapsulation layer on a side of the plurality of display units and the plurality of connection units facing away from the first support plate.

20. The method according to claim 19, before forming the plurality of first release agent films, the method further comprising: bonding a temporary protective film and a second support plate to a side of the flexible substrate facing away from the first support plate in sequence; and
after bonding the plurality of display units to the adhesive layer, the method further comprising: removing the temporary protective film and the second support plate.

* * * * *